United States Patent
Yossef

(10) Patent No.: US 9,453,864 B2
(45) Date of Patent: Sep. 27, 2016

(54) METHOD OF ANALYZING PATCHING AMONG A PORT OF A FIRST PANEL AND PORTS OF ANOTHER PANEL

(75) Inventor: Shay Yossef, Moshav Maor (IL)

(73) Assignee: HCS KABLOLAMA SISTEMLERI SAN VE TIC.A.S., Istanbul (TR)

( * ) Notice: Subject to any disclaimer, the term of this patent is extended or adjusted under 35 U.S.C. 154(b) by 474 days.

(21) Appl. No.: 14/112,508

(22) PCT Filed: Apr. 18, 2012

(86) PCT No.: PCT/IL2012/050140
§ 371 (c)(1),
(2), (4) Date: Oct. 17, 2013

(87) PCT Pub. No.: WO2012/143926
PCT Pub. Date: Oct. 26, 2012

(65) Prior Publication Data
US 2014/0043043 A1 Feb. 13, 2014

Related U.S. Application Data

(60) Provisional application No. 61/476,456, filed on Apr. 18, 2011.

(51) Int. Cl.
*G08B 21/00* (2006.01)
*G01R 27/28* (2006.01)
*H04Q 1/02* (2006.01)

(52) U.S. Cl.
CPC ............... *G01R 27/28* (2013.01); *H04Q 1/136* (2013.01)

(58) Field of Classification Search
CPC ...................................... G01R 27/28
USPC ................ 340/540, 686.1, 687; 324/66; 379/26.01, 25
See application file for complete search history.

(56) References Cited

U.S. PATENT DOCUMENTS 3,986,106 A 10/1976 Shuck et al.
5,483,467 A 1/1996 Krupka et al.
5,523,747 A 6/1996 Wise
(Continued)

FOREIGN PATENT DOCUMENTS

EP 1796403 A2 6/2007
RU 2310210 11/2007
RU 2310210 A1 11/2007

OTHER PUBLICATIONS

Sep. 10, 2002 International Search Report in connection with PCT/IL12/050140.
(Continued)

*Primary Examiner* — Jeffery Hofsass
(74) *Attorney, Agent, or Firm* — D.Kligler IP Services Ltd.

(57) ABSTRACT

A method of analyzing patching among a first port of a first panel and ports of one or more other panels, comprising obtaining with respect to the first port of the first panel an indication of multiple concurrent patchings between the first port and each of two or more different ports of other panels, the two or more different ports including at least a second port and a third port; injecting a scan signal between the first port and the second port and sensing for a corresponding returned signal between the second and the third ports; determining that an indication of a patching between the first port and the second port is false when a returned signal corresponding to the scan signal is detected between the second and the third ports.

67 Claims, 13 Drawing Sheets

(56) References Cited

U.S. PATENT DOCUMENTS

| | | |
|---|---|---|
| 5,677,633 A | 10/1997 | Moser et al. |
| 5,731,755 A | 3/1998 | Boxer |
| 6,079,259 A | 6/2000 | Starman |
| 6,198,292 B1 | 3/2001 | Kirk et al. |
| 6,218,930 B1 | 4/2001 | Katzenberg et al. |
| 6,259,258 B1 | 7/2001 | Cook et al. |
| 6,356,532 B1 | 3/2002 | Richardson et al. |
| 6,590,374 B1 | 7/2003 | Har-Lev |
| 6,961,675 B2 | 11/2005 | David |
| 7,002,353 B1 | 2/2006 | Lo et al. |
| 7,057,899 B2 | 6/2006 | AbuGhazaleh et al. |
| 7,081,764 B1 | 7/2006 | Pandya et al. |
| 7,409,294 B2 | 8/2008 | Mead et al. |
| 7,672,782 B2 | 3/2010 | Mead et al. |
| 8,970,237 B2 | 3/2015 | Martin et al. |
| 2002/0062189 A1 | 5/2002 | Kannonji |
| 2002/0076950 A1 | 6/2002 | Frostrom et al. |
| 2002/0105344 A1 | 8/2002 | Bohley |
| 2002/0151201 A1 | 10/2002 | Bohbot |
| 2003/0026009 A1 | 2/2003 | Vandenbrink |
| 2003/0159609 A1 | 8/2003 | Rauscher |
| 2004/0021452 A1 | 2/2004 | Hwang et al. |
| 2004/0101133 A1 | 5/2004 | Le et al. |
| 2004/0220736 A1 | 11/2004 | Wallace et al. |
| 2005/0090982 A1 | 4/2005 | Mead et al. |
| 2005/0111063 A1 | 5/2005 | Shar et al. |
| 2005/0156757 A1 | 7/2005 | Garner |
| 2005/0179533 A1 | 8/2005 | Stevenson |
| 2005/0187701 A1 | 8/2005 | Baney |
| 2005/0242825 A1 | 11/2005 | Bottman et al. |
| 2005/0258818 A1 | 11/2005 | West |
| 2005/0259033 A1 | 11/2005 | Levine |
| 2005/0264299 A1 | 12/2005 | Manani et al. |
| 2006/0063406 A1 | 3/2006 | Shifris et al. |
| 2006/0094291 A1 | 5/2006 | Caveney et al. |
| 2006/0128212 A1 | 6/2006 | Carrick |
| 2006/0181433 A1 | 8/2006 | Wolterman |
| 2006/0181449 A1 | 8/2006 | Aker |
| 2006/0256540 A1 | 11/2006 | AbuGhazaleh et al. |
| 2007/0030014 A1 | 2/2007 | Pandya et al. |
| 2007/0132503 A1 | 6/2007 | Nordin |
| 2007/0132573 A1 | 6/2007 | Quach et al. |
| 2007/0206749 A1 | 9/2007 | Pincu et al. |
| 2007/0241757 A1 | 10/2007 | Ku et al. |
| 2007/0276600 A1 | 11/2007 | King et al. |
| 2008/0045075 A1 | 2/2008 | Caveney et al. |
| 2008/0082594 A1 | 4/2008 | Soltes et al. |
| 2008/0141056 A1 | 6/2008 | AbuGhazaleh et al. |
| 2008/0168283 A1 | 7/2008 | Penning |
| 2008/0174453 A1 | 7/2008 | Schofield |
| 2008/0253556 A1 | 10/2008 | Cobb et al. |
| 2008/0320541 A1 | 12/2008 | Zinevich |
| 2009/0055666 A1 | 2/2009 | Yee |
| 2009/0177769 A1 | 7/2009 | Roberts |
| 2010/0008482 A1 | 1/2010 | Tucker |
| 2010/0033174 A1 | 2/2010 | Gleich et al. |
| 2010/0117864 A1 | 5/2010 | Makukhin |
| 2010/0159742 A1 | 6/2010 | Chen |
| 2010/0176962 A1 | 7/2010 | Yossef |
| 2010/0214126 A1 | 8/2010 | Publicover |
| 2011/0112720 A1 | 5/2011 | Keep et al. |
| 2011/0128136 A1 | 6/2011 | Katoh et al. |
| 2011/0258839 A1 | 10/2011 | Probst |
| 2011/0298603 A1 | 12/2011 | King et al. |
| 2014/0184238 A1 | 7/2014 | Yossef |

OTHER PUBLICATIONS

Oct. 18, 2013 Written Opinion in connection with PCT/IL12/050140.
Oct. 22, 2013 International Preliminary Report on Patentability in connection with PCT/IL12/050140.
International Application PCT/IL2012/050140 Search report dated Oct. 9, 2012.
U.S. Appl. No. 12/687,162 Office Action dated Feb. 14, 2013.
International Application PCT/IB2014/058680 Search Report dated May 20, 2014.
US Appl. No. 14/173,889 Office Action dated May 6, 2016.

METHOD OF ANALYZING PATCHING AMONG A PORT OF A FIRST PANEL AND PORTS OF ANOTHER PANEL

FIELD OF THE INVENTION

The present invention is in the field of cabling systems.

BACKGROUND OF THE INVENTION

European Patent Publication 1796403 discloses a method and apparatus for incorporating guided network cable Move/Add/Change (MAC) work order capability into a power patch panel. MAC work orders may be controlled and monitored using in-band signaling using, e.g., standard RJ-45 patch cords. Cable detection is performed at a port level on a real-time basis. Coordination of guided MAC operations may be performed by the patch panel, independently, or in conjunction with, or under the control of, a remote Network Management System. The patch panel may be in either an interconnect or cross-connect configuration.

SUMMARY OF THE INVENTION

The method or apparatus according to the subject matter of the present application can have features of different aspects described below, or their equivalents, in any combination thereof, which can also be combined with any feature or features of the method or apparatus described in the Detailed Description presented below, or their equivalents.

There is provided according to an aspect of the disclosed subject matter a method of analyzing patching among a first port of a first panel and ports of one or more other panels. According to examples of the presently disclosed subject matter, the method of analyzing patching among a first port of a first panel and ports of one or more other panels includes: obtaining with respect to the first port of the first panel an indication of multiple concurrent patchings between the first port and each of two or more different ports of other panels, the two or more different ports including at least a second port and a third port; injecting a scan signal between the first port and the second port and sensing for a corresponding returned signal between the second and the third ports; determining that an indication of a patching between the first port and the second port is false when a returned signal corresponding to the scan signal is detected between the second and the third ports.

According to examples of the presently disclosed subject matter, obtaining can include: obtaining with respect to the first port of the first panel an indication of multiple concurrent patchings between the first port and each of a second, a third and a fourth ports of other panel(s); the injecting comprises a first injecting operation comprising injecting a scan signal through the first port and collecting a respective returned signal through the second port or vice-versa, and concurrently sensing for a corresponding impeded signal between the second and the third ports or between the second and the fourth ports, and a second injecting operating comprising injecting a scan signal through the first port and collecting a respective returned signal through the third port or vice-versa, and concurrently sensing for a corresponding impeded signal between the third and the second ports or between the third and the fourth ports; the determining comprises, determining that an indication of a patching between the first port and the second port, and an indication of a patching between the first port and the third port are false, when for the first injecting an impeded signal corresponding to the scan signal is detected between the second and the third ports or between the second and the fourth ports, and for the second injecting an impeded signal corresponding to the scan signal is detected between the third and the second ports or between the third and the fourth ports, respectively.

According to examples of the presently disclosed subject matter, the method can include: determining that an indication of a patching between the first port and the second port is true when substantially no signal corresponding to the scan signal is sensed between the second and the third ports.

According to examples of the presently disclosed subject matter, the method can include: determining that an indication of a patching between the first port and the second port is true when for the first injecting substantially no signal corresponding to the scan signal is sensed is between the second and the third ports or between the second and the fourth ports.

According to examples of the presently disclosed subject matter, the method can include determining that an indication of a patching between the first port and the third port is true when for the second injecting substantially no signal corresponding to the scan signal is sensed between the third and the second ports or between the third and the fourth ports, respectively.

According to examples of the presently disclosed subject matter, the method can further include determining that an indication of a patching between the first port and the second port is true when substantially no signal corresponding to the scan signal is sensed between the second and the third ports.

According to further examples of the presently disclosed subject matter, obtaining can include injecting a scan signal through the second port and collecting a respective returned signal through the third port or vice-versa, and sensing for an impeded signal between the second and third ports that is indicative of a shared non-isolated termination.

In yet further examples of the presently disclosed subject matter, obtaining can include injecting a scan signal through the second port and collecting a respective returned signal through each port of the same panel, and sensing for an impeded signal between the first port and each of the other ports of the same panel, and determining that there is a shared non-isolated termination between the first port and another port of the same panel when an impeded signal is sensed between the first port and the other port of the same panel.

In still further examples of the presently disclosed subject matter, obtaining can include injecting a scan signal through the first port and sensing for a respective returned signal through at least the second port, and in case the respective returned signal is collected through the second port, generating an indication of multiple concurrent patchings between the first port and each of the second port and the third ports.

In yet further examples of the presently disclosed subject matter, obtaining can include injecting a scan signal through the first port and sensing for a respective returned signal through at least the second port, and in case the respective returned signal is collected through the second port, generating an indication of multiple concurrent patchings between the first port and each of the second, third and fourth ports.

In further examples of the presently disclosed subject matter, obtaining can include injecting the scan signal through the first port and sensing for a respective returned signal through a plurality of ports of one or more other panels, and in case the respective returned signal is collected through two or more ports of the other panel(s), generating an indication of multiple concurrent patchings between the first port and the two or more ports of the other panel(s) through which the returned signal was collected.

In examples of the presently disclosed subject matter, injecting can include injecting the scan signal through one or more twisted pairs from among the standard 4 twisted pairs of RJ-45 ports.

In examples of the presently disclosed subject matter, obtaining can include sensing for the returned signal through one or more twisted pairs from among the standard 4 twisted pairs of RJ-45 ports.

There is yet further provided according to an aspect of the disclosed subject matter a method of analyzing patching among a first port of a first panel and ports of one or more other panels. According to examples of the presently disclosed subject matter, the method of analyzing patching among a first port of a first panel and ports of one or more other panels can include: obtaining an indication of a non-isolated shared common termination between two or more ports of a first panel, the two or more ports including at least a first port and a second port; obtaining an indication of a patching among a third port of a second panel and at least one of the first or second ports of the first panel, and while injecting a scan signal through the third port and collecting a respective returned signal through the first port or vice-versa, sensing between the first and the second ports for a corresponding impeded signal; and determining that an indication of a patching between the third port and the first port is false when an impeded signal corresponding to the scan signal is detected between the first and the second ports.

According to examples of the presently disclosed subject matter, the method can further include determining that an indication of a patching between the first port and the second port is true when substantially no signal corresponding to the scan signal is sensed between the second and the third ports.

According to further examples of the presently disclosed subject matter, obtaining can include injecting a scan signal through the second port and collecting a respective returned signal through the third port or vice-versa, and sensing for an impeded signal between the second and third ports that is indicative of a shared non-isolated termination.

In yet further examples of the presently disclosed subject matter, obtaining can include injecting a scan signal through the second port and collecting a respective returned signal through each port of the same panel, and sensing for an impeded signal between the first port and each of the other ports of the same panel, and determining that there is a shared non-isolated termination between the first port and another port of the same panel when an impeded signal is sensed between the first port and the other port of the same panel.

In still further examples of the presently disclosed subject matter, obtaining can include injecting a scan signal through the first port and sensing for a respective returned signal through at least the second port, and in case the respective returned signal is collected through the second port, generating an indication of multiple concurrent patchings between the first port and each of the second port and the third ports.

In yet further examples of the presently disclosed subject matter, obtaining can include injecting a scan signal through the first port and sensing for a respective returned signal through at least the second port, and in case the respective returned signal is collected through the second port, generating an indication of multiple concurrent patchings between the first port and each of the second, third and fourth ports.

In further examples of the presently disclosed subject matter, obtaining can include injecting the scan signal through the first port and sensing for a respective returned signal through a plurality of ports of one or more other panels, and in case the respective returned signal is collected through two or more ports of the other panel(s), generating an indication of multiple concurrent patchings between the first port and the two or more ports of the other panel(s) through which the returned signal was collected.

In examples of the presently disclosed subject matter, injecting can include injecting the scan signal through one or more twisted pairs from among the standard 4 twisted pairs of RJ-45 ports.

In examples of the presently disclosed subject matter, obtaining can sensing for the returned signal through one or more twisted pairs from among the standard 4 twisted pairs of RJ-45 ports.

In yet a further aspect of the examples of the presently disclosed subject matter, there is provided a network scanner for analyzing patching among a first port of a first panel and ports of one or more other panels. According to examples of the presently disclosed subject matter, the network scanner can include a processing unit and a control and sensing unit. The processing unit can have an indication of multiple concurrent patchings between a first port and each of two or more different ports of other panels, the two or more different ports including at least a second port and a third port. The control and sensing unit can be adapted to inject a scan signal between the first port and the second port, and adapted to sense for a corresponding returned signal between the second and the third ports. The processing unit can be configured to determine that an indication of a patching between the first port and the second port is false when a returned signal corresponding to the scan signal is detected between the second and the third ports.

According to examples of the presently disclosed subject matter, The processing unit can have with respect to the first port of the first panel an indication of multiple concurrent patchings between the first port and each of a second, a third and a fourth ports of other panel(s). The control and sensing unit can be adapted to implement: a first inject operation comprising injecting a scan signal through the first port and collecting a respective returned signal through the second port or vice-versa, and concurrently sensing for a corresponding impeded signal between the second and the third ports or between the second and the fourth ports, and a second inject operating comprising injecting a scan signal through the first port and collecting a respective returned signal through the third port or vice-versa, and concurrently sensing for a corresponding impeded signal between the third and the second ports or between the third and the fourth ports. The processing unit can be adapted to determine that an indication of a patching between the first port and the second port, and an indication of a patching between the first port and the third port are false, when for said first inject operating an impeded signal corresponding to the scan signal is detected between the second and the third ports or between the second and the fourth ports, and for said second inject operation an impeded signal corresponding to the scan signal is detected between the third and the second ports or between the third and the fourth ports, respectively.

According to examples of the presently disclosed subject matter, the processing unit can be adapted to determine that an indication of a patching between the first port and the second port is true when for said first inject operation substantially no signal corresponding to the scan signal is sensed is between the second and the third ports or between the second and the fourth ports.

In still further examples of the presently disclosed subject matter, the processing unit can be adapted to determine that an indication of a patching between the first port and the third port is true when for said second inject operation substantially no signal corresponding to the scan signal is sensed between the third and the second ports or between the third and the fourth ports, respectively.

According to examples of the presently disclosed subject matter, the processing unit can be adapted to determine that an indication of a patching between the first port and the second port is true when substantially no signal corresponding to the scan signal is sensed between the second and the third ports.

According to yet further examples of the presently disclosed subject matter, the control and sensing unit can be adapted to: inject a scan signal through the second port; collect a respective returned signal through the third port or vice-versa; and sense for an impeded signal between the second and third ports that is indicative of a shared non-isolated termination.

In yet further examples of the presently disclosed subject matter, the control and sensing unit can be adapted to: inject a scan signal through the second port; collect a respective returned signal through the third port or vice-versa; and sense for an impeded signal between the second and third ports that is indicative of a shared non-isolated termination.

In still further examples of the presently disclosed subject matter, the control and sensing unit can be adapted to: inject a scan signal through the second port; collect a respective returned signal through each port of the same panel; sense for an impeded signal between the first port and each of the other ports of the same panel; and determine that there is a shared non-isolated termination between the first port and another port of the same panel when an impeded signal is sensed between the first port and the other port of the same panel.

In yet further examples of the presently disclosed subject matter, the control and sensing unit can be configured to: inject a scan signal through the first port; sense for a respective returned signal through at least the second port; and in case the respective returned signal is collected through the second port, generate an indication of multiple concurrent patchings between the first port and each of the second port and the third ports.

According to examples of the presently disclosed subject matter, the control and sensing unit can be configured to: inject a scan signal through the first port; sense for a respective returned signal through at least the second port; and in case the respective returned signal is collected through the second port, generate an indication of multiple concurrent patchings between the first port and each of the second, third and fourth ports.

In further examples of the presently disclosed subject matter, the control and sensing unit can be configured to: inject the scan signal through the first port; sense for a respective returned signal through a plurality of ports of one or more other panels; and in case the respective returned signal is collected through two or more ports of the other panel(s), generate an indication of multiple concurrent patchings between the first port and the two or more ports of the other panel(s) through which the returned signal was collected.

According to examples of the presently disclosed subject matter, the control and sensing unit can be adapted to inject the scan signal through one or more twisted pairs from among the standard 4 twisted pairs of RJ-45 ports.

According to examples of the presently disclosed subject matter, the control and sensing unit can be adapted to sense for the retuned signal through one or more twisted pairs from among the standard 4 twisted pairs of RJ-45 ports.

According to yet a further aspect of the examples of the presently disclosed subject matter, there is provided a computer network. According to examples of the presently disclosed subject matter, the computer network can include a first panel, one or more panels other than the first panel and a network scanner. The network scanner can have an indication of multiple concurrent patchings between a first port and each of two or more different ports of other panels, the two or more different ports including at least a second port and a third port. The network scanner can be adapted to inject a scan signal between the first port and the second port, and adapted to sense for a corresponding returned signal between the second and the third ports. The network scanner can be configured to determine that an indication of a patching between the first port and the second port is false when a returned signal corresponding to the scan signal is detected between the second and the third ports.

According to examples of the presently disclosed subject matter, the network scanner can have with respect to the first port of the first panel an indication of multiple concurrent patchings between the first port and each of a second, a third and a fourth ports of other panel(s). The network scanner can be adapted to implement: a first inject operation comprising injecting a scan signal through the first port and collecting a respective returned signal through the second port or vice-versa, and concurrently sensing for a corresponding impeded signal between the second and the third ports or between the second and the fourth ports, and a second inject operating comprising injecting a scan signal through the first port and collecting a respective returned signal through the third port or vice-versa, and concurrently sensing for a corresponding impeded signal between the third and the second ports or between the third and the fourth ports. The network scanner can be adapted to determine that an indication of a patching between the first port and the second port, and an indication of a patching between the first port and the third port are false, when for said first inject operating an impeded signal corresponding to the scan signal is detected between the second and the third ports or between the second and the fourth ports, and for said second inject operation an impeded signal corresponding to the scan signal is detected between the third and the second ports or between the third and the fourth ports, respectively.

According to examples of the presently disclosed subject matter, the network scanner can be adapted to determine that an indication of a patching between the first port and the second port is true when for said first inject operation substantially no signal corresponding to the scan signal is sensed is between the second and the third ports or between the second and the fourth ports.

According to further examples of the presently disclosed subject matter, the network scanner can be adapted to determine that an indication of a patching between the first port and the third port is true when for said second inject operation substantially no signal corresponding to the scan signal is sensed between the third and the second ports or between the third and the fourth ports, respectively.

According to examples of the presently disclosed subject matter, the network scanner can be adapted to determine that an indication of a patching between the first port and the second port is true when substantially no signal corresponding to the scan signal is sensed between the second and the third ports.

In still further examples of the presently disclosed subject matter, the network scanner can be adapted to: inject a scan signal through the second port, collect a respective returned signal through the third port or vice-versa, and sense for an impeded signal between the second and third ports that is indicative of a shared non-isolated termination.

In further examples of the presently disclosed subject matter, the network scanner can be adapted to: inject a scan signal through the second port, collect a respective returned signal through the third port or vice-versa, and sense for an impeded signal between the second and third ports that is indicative of a shared non-isolated termination.

In yet further examples of the presently disclosed subject matter, the network scanner can be adapted to: inject a scan signal through the second port, collect a respective returned signal through each port of the same panel, sense for an impeded signal between the first port and each of the other ports of the same panel, and determine that there is a shared non-isolated termination between the first port and another port of the same panel when an impeded signal is sensed between the first port and the other port of the same panel.

In still further examples of the presently disclosed subject matter, the network scanner can be adapted to: inject a scan signal through the first port, sense for a respective returned signal through at least the second port, and in case the respective returned signal is collected through the second port, generate an indication of multiple concurrent patchings between the first port and each of the second port and the third ports.

In still further examples of the presently disclosed subject matter, the network scanner can be adapted to: inject a scan signal through the first port, sense for a respective returned signal through at least the second port, and in case the respective returned signal is collected through the second port, generate an indication of multiple concurrent patchings between the first port and each of the second, third and fourth ports.

In still further examples of the presently disclosed subject matter, the network scanner can be adapted to: inject the scan signal through the first port, sensing for a respective returned signal through a plurality of ports of one or more other panels, and in case the respective returned signal is collected through two or more ports of the other panel(s), generate an indication of multiple concurrent patchings between the first port and the two or more ports of the other panel(s) through which the returned signal was collected.

In some examples of the presently disclosed subject matter, the network scanner can be adapted to inject the scan signal through one or more twisted pairs from among the standard 4 twisted pairs of RJ-45 ports.

In some examples of the presently disclosed subject matter, the network scanner can be adapted to sense for the returned signal through one or more twisted pairs from among the standard 4 twisted pairs of RJ-45 ports.

According to still a further aspect of the presently disclosed subject matter, a computer network can include a first panel one or more panels other than the first panel and a network scanner. The network scanner can have an indication of a non-isolated shared common termination between two or more ports of the first panel, the two or more ports including at least a first port and a second port, The network scanner can be adapted to inject a scan signal through a third port and collect a respective returned signal through the first port or vice-versa, and concurrently sense between the first and the second ports for a corresponding impeded signal. The network scanner can be configured to determine that an indication of a patching between the third port and the first port is false when an impeded signal corresponding to the scan signal is detected between the first and the second ports.

In some examples of the presently disclosed subject matter, the network scanner can be adapted to determine that an indication of a patching between the first port and the second port is true when substantially no signal corresponding to the scan signal is sensed between the second and the third ports.

In further examples of the presently disclosed subject matter, the network scanner can be adapted to: inject a scan signal through the second port, collect a respective returned signal through the third port or vice-versa, and sense for an impeded signal between the second and third ports that is indicative of a shared non-isolated termination.

In still further examples of the presently disclosed subject matter, the network scanner can be adapted to: inject a scan signal through the second port, collect a respective returned signal through each port of the same panel, sense for an impeded signal between the first port and each of the other ports of the same panel, and determine that there is a shared non-isolated termination between the first port and another port of the same panel when an impeded signal is sensed between the first port and the other port of the same panel.

In yet further examples of the presently disclosed subject matter, the network scanner can be adapted to: inject a scan signal through the first port, sense for a respective returned signal through at least the second port, and in case the respective returned signal is collected through the second port, generate an indication of multiple concurrent patchings between the first port and each of the second port and the third ports.

In further examples of the presently disclosed subject matter, the network scanner can be adapted to: inject a scan signal through the first port, sense for a respective returned signal through at least the second port, and in case the respective returned signal is collected through the second port, generate an indication of multiple concurrent patchings between the first port and each of the second, third and fourth ports.

In further examples of the presently disclosed subject matter, the network scanner can be adapted to: inject the scan signal through the first port, sensing for a respective returned signal through a plurality of ports of one or more other panels, and in case the respective returned signal is collected through two or more ports of the other panel(s), generate an indication of multiple concurrent patchings between the first port and the two or more ports of the other panel(s) through which the returned signal was collected.

In further examples of the presently disclosed subject matter, the network scanner can be adapted to inject the scan signal through one or more twisted pairs from among the standard 4 twisted pairs of RJ-45 ports.

In further examples of the presently disclosed subject matter, the network scanner can be adapted to sense for the returned signal through one or more twisted pairs from among the standard 4 twisted pairs of RJ-45 ports.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

Figure 1:
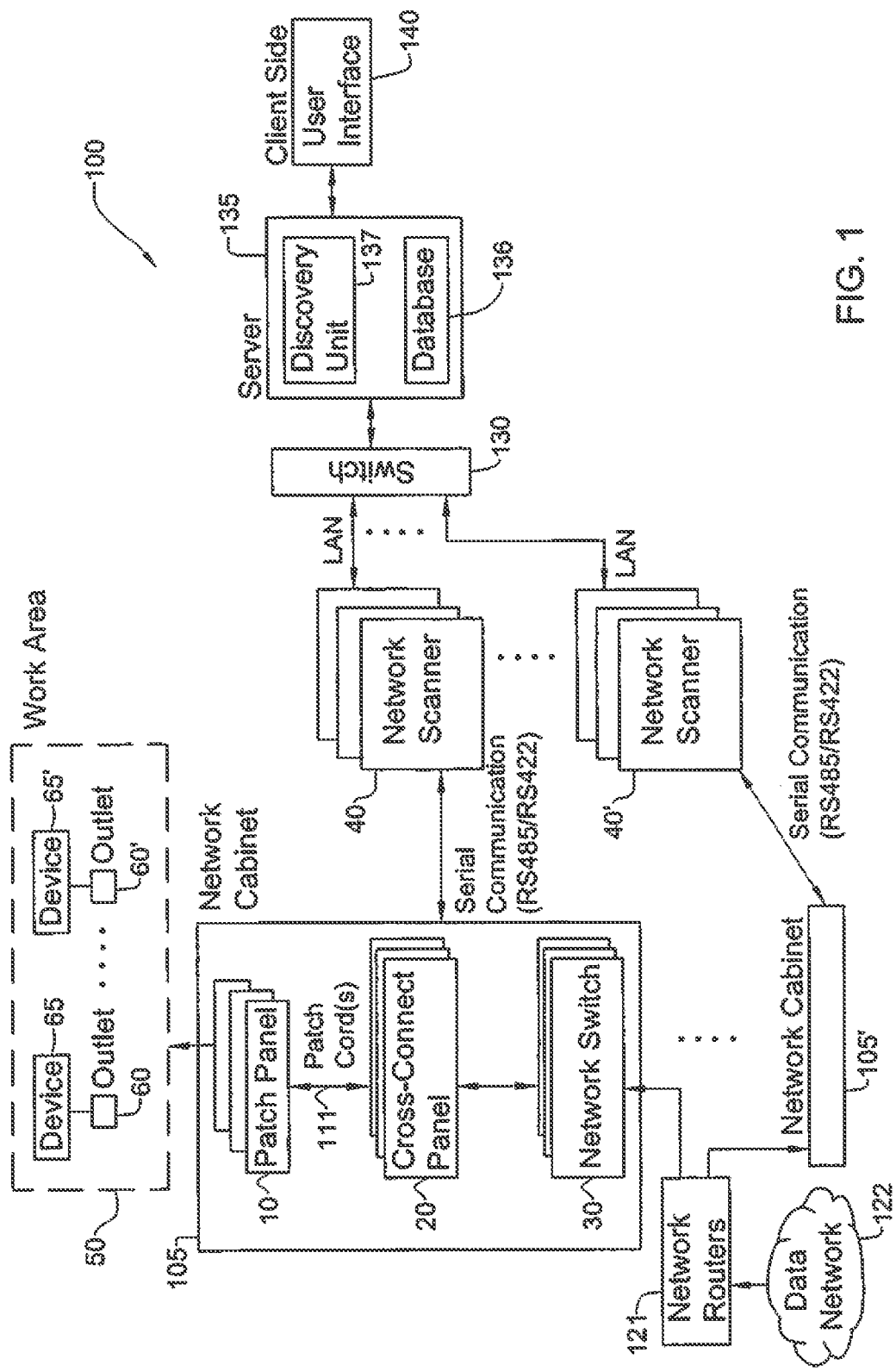
FIG. 1 is a block diagram illustration of a conventional Local Area Network ("LAN" including components, according to the presently disclosed subject matter.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the presently disclosed subject matter. However, it will be understood by those skilled in the art that the presently disclosed subject matter may be practiced without these specific details. In other instances, well-known methods, procedures and components have not been described in detail so as not to obscure the presently disclosed subject matter.

Unless specifically stated otherwise, as apparent from the following discussions, it is appreciated that throughout the specification discussions various functional terms refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such tangible information storage, transmission or display devices.

According to an example of the presently disclosed subject matter, a method of analyzing patching among a first port of a first panel and ports of one or more other panels can include: obtaining with respect to the first port of the first panel an indication of multiple concurrent patchings between the first port and each of two or more different ports of other panels, the two or more different ports including at least a second port and a third port; injecting a scan signal through the first port and collecting a respective returned signal through the second port or vice-versa, and concurrently sensing for a corresponding impeded signal between the second and the third ports; and determining that an indication of a patching between the first port and the second port is false when an impeded signal corresponding to the scan signal is detected between the second and the third ports.

Throughout the description of examples of the presently disclosed subject matter reference is made to term "current level". It would be appreciated, that the term "current level" is used herein to describe a measure of a characteristic of a scan signal or a characteristic of a returned signal or a difference between a scan signal and a respective retuned signal. It would also be appreciated that "current" can be used as an example of characteristic of a signal, and "current level" can be used as an example of a measure of a characteristic of a signal that can be used as part of certain examples of the presently disclosed subject matter. Further by way of example, the reference made to the term "current level" is intended to cover similar measures of other characteristic a signal (e.g., a scan signal, a returned signal or a difference therebetween), which are know in the art to be related to a current level of a signal, such as: a voltage level and impedance level.

A Network Switch or a Switch is a device that channels data from any one of multiple input ports to a specific output port of the switch which is associated with the intended destination of the data. On an Ethernet local area network (LAN), a switch determines from the physical device (Media Access Control or MAC) address in each incoming message frame which output port to forward it to and out of. A switch as used herein, includes a switch having ports that enable a layer 1 (patching) connection to a corresponding PP and in parallel enable a layer 1 sensing therethrough of a respective channel.

In case the network infrastructure (or some segment thereof) is implemented in accordance with an interconnect configuration, the switch that is used in conjunction with the interconnect configuration is of the type that includes ports that enable a layer 1 (patching) connection to a corresponding PP and in parallel enable a layer 1 sensing therethrough of a respective channel.

A "panel" as used herein relates to a network component that includes a plurality of ports. According to examples of the presently disclosed subject matter, panels can be used in a cross-connect configuration or in an interconnect configuration. In a cross connect configuration one or more panels are connected to a plurality of remote node and other one or more panel are connected to a plurality of switch ports. The panels connected to the remote nodes and the panel connected to the switch ports are interconnected by a patch cable and thus provide interconnectivity between the ports of the remote nodes and the switch ports. The panels connected to the remote nodes ports are referred to herein as "patch panels", and the panels connected to the switch(es) ports are referred to herein as "cross connect panels". It should be noted that according to examples of the presently disclosed subject matter, a cross-connect panel and a patch panel can be implemented such that they are substantially identical in terms of their respective architecture. Further according to examples of the presently disclosed subject matter, a cross-connect panel and a patch panel can be implemented such that they are substantially identical in terms of their respective architecture and in terms of their respective principal of operation. Still further by way of example, a cross-connect panel and a patch panel can include substantially identical hardware components or modules and, optionally, substantially identical software components or modules. Yet further by way of example, a panel can be classified as either a patch panel or a cross-connect panel according to a network element to which it is connected and/or according to its respective utility within the LAN. In this regard the classification of the panel is a patch panel or as a cross connect panel can be based, for example, on the type of network element to which it is connected and/or according to its respective utility within the LAN, and the classification would not necessarily (although it could) be based on the panel's structure. In other examples of the presently disclosed subject matter, the patch panel(s) and the cross-connect panel(s) are structurally different and can include different hardware and/or software, and can have a different utility within the LAN.

According to examples of the presently disclosed subject matter, in an interconnect configuration, the cross connect panels are eliminated, and a switch having ports that enable a layer 1 (patching) connection to a corresponding PP and in parallel enable a layer 1 sensing therethrough of a respective channel substitute the cross connect panel. Such, switches can incorporate the components of the cross connect panel which are required for enabling the scans described hereinbelow, and can include the appropriate components to allow communication with a network scanner that can be involved in such scans. Those versed in the art can readily apply the examples of the presently disclosed subject matter provided herein, described with respect to a cross connect configuration, to a corresponding interconnect configuration, and the application of the herein disclosed examples to corresponding interconnect configuration is regarded as an integral part of the herein provided disclosure.

Throughout the description of examples of the presently disclosed subject matter reference is made to term "patch cord", "patch cable" and the like. The terms "patch cord", "patch cable" and similar terms relate to a physical cable that is used to connect two ports of two different panels, where one of the two ports is connectable at its other end to a remote node, and the other port is connectable at its other end to a switch port. In an interconnect configuration a "patch cord", a "patch cable" and similar terms relate to a connection between a patch panel port and a switch port.

Throughout the description of examples of the presently disclosed subject matter, reference is made to the term "network elements". The term "network elements" relates to various tangible elements of a data communication network that are involved in the communication between nodes, including the nodes themselves. By way of non-limiting example, network elements can include the following: patch panels cross-connect panels, remote nodes including: switches, end points and networked peripherals, ports, cables, connectors.

Throughout the description of examples of the presently disclosed subject matter, reference is made to the term "remote node". The term "remote node" relates to networked end point devices, such as, but not limited to, networked printers, personal computers, VOIP terminals, servers and any other peripheral or similar device physically connected (by cable) to the LAN network.

Reference is now made to FIG. 1 which is a block diagram illustration of a conventional Local Area Network ("LAN") including components according to the presently disclosed subject matter. In FIG. 1, there is shown a segment of a LAN 100, according to an example of the presently disclosed subject matter, that includes a patch panel ("PP") 10, a cross connect ("CC") panel 20, a switch 30, a network scanner 40 and a work area 50 that includes work area outlets 60 and remote nodes 65. The network infrastructure shown in FIG. 1 is implemented in accordance with a cross connect configuration. In the cross connect configuration, the patch panel 10 ports are connected to the network switch 30 ports through (ports of) the cross connect panel 20, and the components which are used in examples of the present disclosure that relate to the cross connect configuration of the network infrastructure are adapted to operate according to the cross connect configuration. In some examples of the presently disclosed subject matter, in addition or as an alternative to the cross connect configuration, the network infrastructure or some components thereof can be implemented and operated according to an interconnect configuration. In the interconnect configuration, the patch panel 10 ports are connected to ports of the network switches 30 directly, and the components which are used in examples of the present disclosure that relate to the interconnect configuration of the network infrastructure are adapted to operate accordingly. The description is made with reference to the cross connect configuration of the network infrastructure, and the functionality of at least some of the components is adapted for the cross connect configuration of the network architecture. Those, versed in the art can readily apply the examples of the presently disclosed subject matter to the interconnect configuration, and such implementation is considered to be part of the present disclosure.

According to examples of the currently disclosed subject matter, each of: the patch panel 10, the cross connect panel 20 and the switch 30 can have a plurality of ports. On one side of the patch panel 10, some or all patch panel ports can be physically connected (OSI layer 1) to ports of remote nodes 65, typically through a plurality of work area outlet ports 60. On the other side of the patch panel 10, some or all of the ports can be physically connected (OSI layer 1) to one side of the cross connect panel 20 ports. On the other side of the cross connect panel 20, some or all of the ports can be physically connected (OSI layer 1) to corresponding ports of the switch 30.

According to examples of the presently disclosed subject matter, a channel is defined as a connection of ports of two or more of the following: a work area outlet and/or a remote node, a patch panel, a cross connect panel, a switch. Further according to examples of the presently disclosed subject matter, at least one of the cables used for inter-connecting two nodes within a channel is a conventional twisted pair cable having four pairs of wires and eight wires altogether. Thus, for example, a port of a patch panel and a work area outlet port interconnected by a conventional twisted pair cable can constitute a channel. In another example, a channel, according to examples of the presently disclosed subject matter, can include a port of a remote node, a work area outlet port that is connected to the port of the remote node, a patch panel port on one side of the patch panel that is connected to the work area outlet port, a cross connect panel port on one side of the cross connect panel that is connected to the other side of the patch panel port, and a switch port that is connected to the other side of the cross connect port, and where at least one of the cables used for inter-connecting two nodes within the channel is a conventional twisted pair cable.

Figure 2:
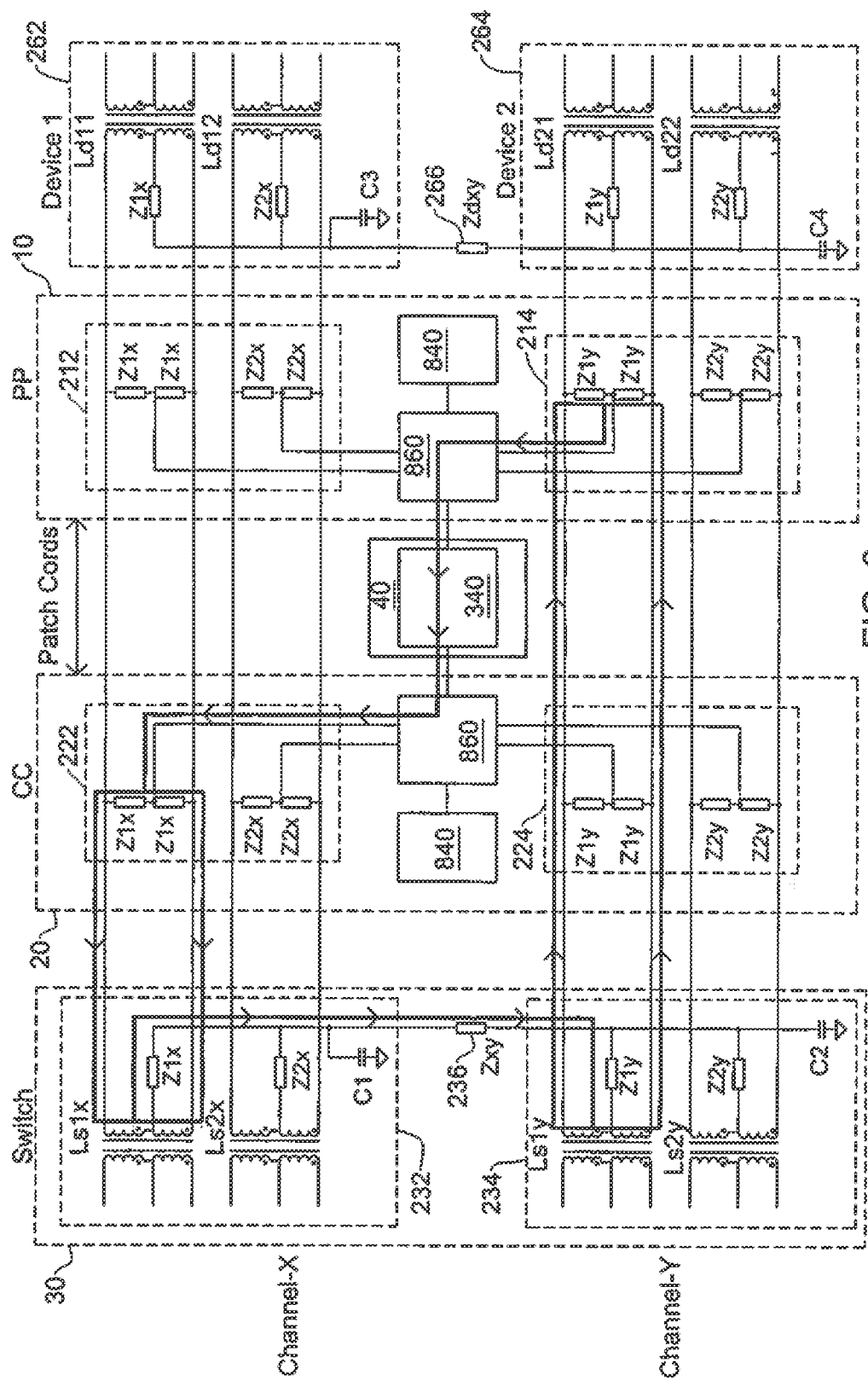
FIG. 2 is a simplified schematic diagram of a segment of the LAN network shown in FIG. 1, according to the presently disclosed subject matter.

Reference is now additionally made to FIG. 2, which is a simplified schematic diagram of a segment of the LAN network shown in FIG. 1. In FIG. 2, by way of example, two ports, namely 212 and 214 of the patch panel 10 are shown. Further by way of example, on one side, the patch panel ports 212 and 214 are connected to respective remote node ports 262 and 264. Each of the remote node ports 262 and 264 is associated with a different (one) remote node. Optionally, the two patch panel ports 212 and 214 are connected to respective remote node ports 262 and 264 through corresponding work area outlet ports (not shown in FIG. 2). On the other side, the patch panel ports 212 and 214 are connected to respective cross connect panel ports 222 and 224. The cross connect panel ports 222 and 224 are connected to the patch panel ports 212 and 214 on one side, and on the other side, the cross connect panel ports 222 and 224 are connected to respective ports 232 and 234 of the switch 30.

Figure 3:
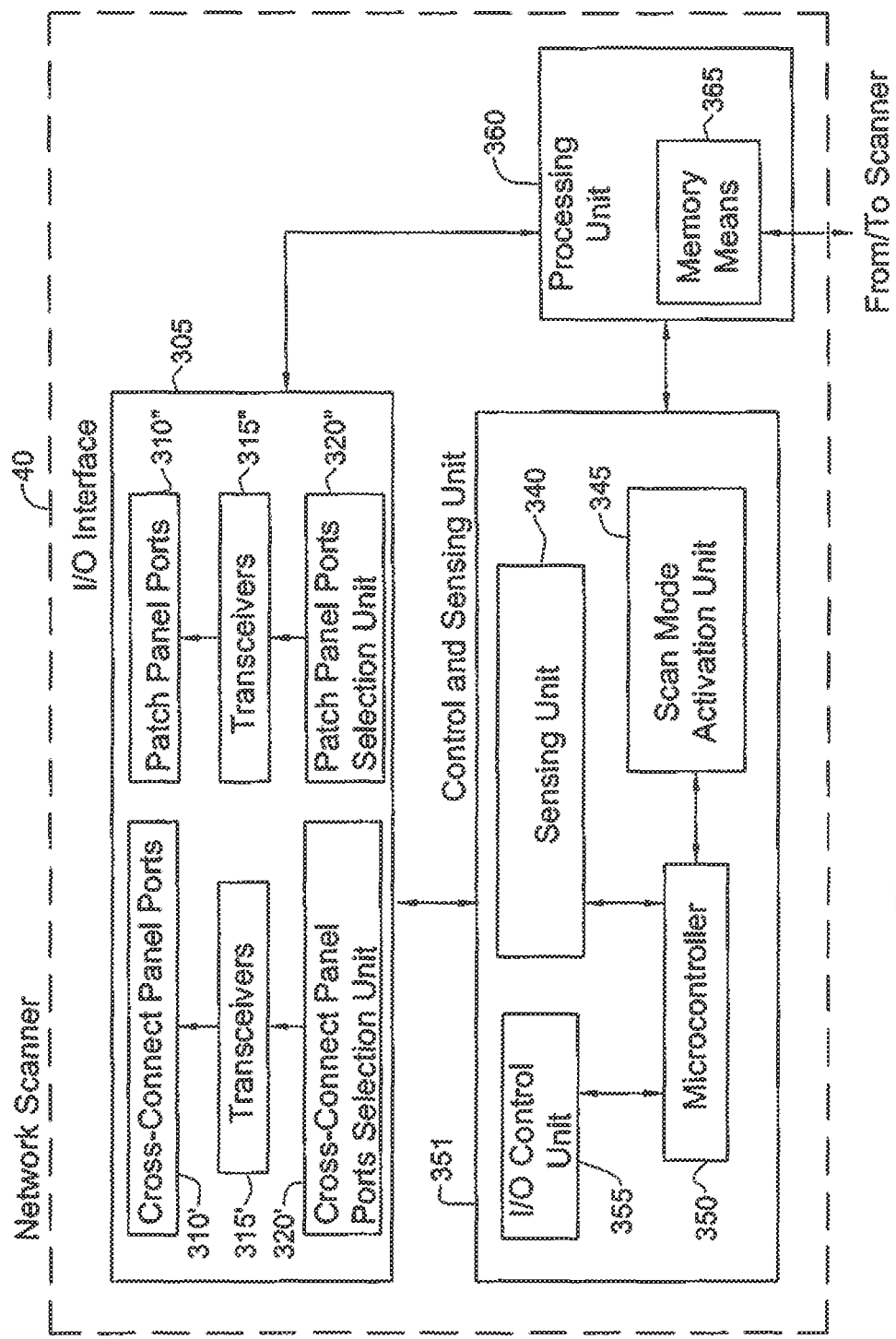
FIG. 3 is a schematic block-diagram illustration of the network scanner architecture, according to examples of the presently disclosed subject matter.

Reference is now made to FIG. 3, which is a schematic block-diagram illustration of the network scanner architecture, according to examples of the presently disclosed subject matter. According to examples of the presently disclosed subject matter, network scanner 40 can include I/O (Input/Output) Interface 305, a processing unit 360 and a control and sensing unit 351.

The I/O (Input/Output) Interface 305 can be used for enabling communications with the patch panel(s) 10 and with the cross-connect panel(s) 20. According to an example of the presently disclosed subject matter, the I/O interface 305 can include a plurality of interfaces 310' each one connectable to a cross-connect panel port, a plurality of interfaces 310" each one connectable to a patch panel port, a plurality of transceivers 315' and 315" and port selection units 320' and 320". The plurality of cross-connect panel I/O ports 310' can be operable for enabling the connection of cross-connect panel(s) ports to the network scanner 40. The plurality of patch panel I/O ports 310" can be operable for enabling the connection of patch panel(s) ports to the network scanner 40. The plurality of transceivers 315' and 315" can be operable for enabling the receipt and transmission of instructions and data to and/or from the network scanner 40. The port selection units 320' and 320" (that can include, for example, a plurality of multiplexers) can be operable for selecting which ports and which transceivers of the I/O Interface 305 are to be used for each communication.

The processing unit 360 can be adapted to control the operation of the network scanner 40, and can initiate and control the sending and receiving of instructions and/or data related to the network elements associated with the network scanner 40. The processing unit 360 can be adapted to initiate and execute any other processing tasks.

According to examples of the presently disclosed subject matter, the processing unit 360 can include a memory module 365. The memory module 365 can be used to memorize computerized instructions. The computerized instructions can correspond to predefined logic that is used to control the operation of the network scanner 40, and can be executed by the processing unit 360. The computerized instructions can be associated with a computer program software that is persistently stored on a tangible computer storage medium (not shown) or the computerized instructions can be associated with instructions received from an operator of the network scanner 40.

According to examples of the presently disclosed subject matter, the control and sensing unit 351 can include a microcontroller 350, I/O control unit 355, a sensing unit 340 and a scan-mode activation unit 345. The sensing unit 340 is adapted to enable detection of a false indication regarding a cable connection within a channel, for example, by executing one more predefined scan cycles, each including predefined set of sensing and processing operations. For example, while the network scanner 40 is adapted to operate according to a cross connect configuration of the network infrastructure, the sensing unit 340 can be adapted to enable detection of a false indication regarding a patching between a patch panel port and a cross-connect panel port. Further by way of example, while the network scanner 40 is adapted to operate according to an interconnect configuration of the network infrastructure, the sensing unit 340 can be adapted to enable detection of a false indication regarding a cable connection between a patch panel port and a switch port. The operation of the sensing unit 340 shall be further described below.

The scan-mode activation unit 345 is adapted to control or select a scan mode of the network scanner 40 and is configured to toggle among several predefined modes. According to examples of the presently disclosed subject matter, the toggling among the different scan modes can be controlled automatically, according to a predefined scan cycle (e.g., according to a scan-mode activation protocol that corresponds to the predefined scan cycle), and/or the scan mode activation can be controlled manually by an operator of the network scanner 40. It would be appreciated that according to some examples of the presently disclosed subject matter, an operator manually controlling the scan mode activation unit 345 can follow a predefined scan-mode activation protocol that corresponds to a respective predefined scan cycle, and can manually select the scan mode of the network scanner 40 according to the predefined scan cycle. The scan modes that are used in certain examples of the presently disclosed subject matter are described below.

The microcontroller 350 can be adapted to control the operation of the control and sensing unit 351 and any of its components. For example, the microcontroller 350 can be adapted to select, before each scan, the cross-connect panel port(s) and/or the patch panel port(s) to which the scanner 40 needs to be connected as will be described in further detail below. Further by way of example, the microcontroller 350 can be adapted to process the scan results, as will also be described in further detail below. The microcontroller 350 can be utilized in cooperation with the processing unit 360. In some examples of the presently disclosed subject matter, the scanner can operate with only the processing unit, and the microcontroller 350 is optional.

According to an example of the presently disclosed subject matter, the scan-mode activation unit 345 can comprise one or more switches that can be activated/deactivated (switched ON/OFF) in a desired sequence, to establish a desired scan-mode.

According to examples of the presently disclosed subject matter, the network scanner 40 can be adapted to perform a predefined set of scans over the network infrastructure, possibly in cooperation with other components of the network infrastructure, for identifying a false cable connection indication within a channel.

Further according to examples of the presently disclosed subject matter, the various scans which constitute the predefined set of scans can be performed in the physical layer (OSI layer 1) and can be carried over a non-intervened channel.

An intervened channel is a channel into which an isolating element is inserted. The isolating element is used to isolate (e.g., electrically, optically, mechanically, etc.) two segments of the channel, e.g., the segments are the two parts of the channel on either side of the inserted element. A non-intervened channel is channel in which an injected signal can free propagate across the channel. An example of a method of scanning an intervened channel is disclosed in European Patent Publication 1796403 to Nordin.

Still further by way of example, the various scans which constitute the predefined set of scans can be in-band scans that are performed in the physical layer (OSI layer 1).

An in-band scan is a scan that is performed over the same (some or all) cabling resources that are used by the functional nodes (e.g., a switch port, a remote node port, a panel port, etc.) of the channel for communication therebetween. An out-of-band scan is carried over a separate band (not the same band that is used by the functional nodes of the channel). It would be appreciated that an out-of-band scan requires at least one wire in addition to the wires used by the functional nodes of the channel. For example, the various scans which constitute the predefined set of scans can performed in the physical layer (OSI layer 1) over a channel that includes at least one conventional twisted pair cable. Still further by way of example, the twisted pair cable can include four pairs of wires and eight wires altogether, and one or more scans from the predefined set of scans can be carried out over a pair of wires of the twisted pair cable. In further examples of the presently disclosed subject matter, one or more scans from the predefined set of scans can be carried out over a single wire of the twisted pair cable.

The predefined set of scans that are implemented by the network scanner for identifying a false cable connection indication and are sometimes referred to herein as a "predefined scan cycle", in short, and the terms "predefined set of scans" and "predefined scan cycle" are used interchangeably. According to an example of the presently disclosed subject matter, the predefined set of scans includes a patch cord scan. As will be described below, a scan cycle can be implemented without a patch cord scan, or the patch cord scan can be an optional scan as part of certain predefined scan cycles. Further by way of example, the data provided by a patch cord scan, and in particular an indication with regard to cable connections between ports of different panels, can be substituted by explicit input of indications with regard to such cable connections. For example, a list of cable connection indications can be received from an operator of the system. A scan cycle, according to examples of the presently disclosed subject matter, can be used to determine which of the cable connection indications, and in particular with regard to cable connections between ports of different panels, are false and which are true.

A patch cord scan is a scan that is carried out by the network scanner 40 and is intended to generate a cable connection indication. In the patch cord scan, the network scanner 40 is configured to connect to a first port of a first panel and to a second port of a second panel. The network scanner 40, for example using the control and sensing unit 351, can inject a scan signal to the first port of the first panel and attempts to collect the signal through the second port of the second panel. In case a signal is collected through the second port, the network scanner generates and possibly records an indication of a cable connection (or a patching) between the first port of the first panel and the second port of the second panel. As will be explained below, under certain circumstances, this indication can be false, and in reality, it could be that the first port of the first panel is not patched (or connected) to the second port of the second panel. In particular, a patch cord scan that is carried out outside the predefined set of scans can result in a false cable connection indication, as will be explained below.

The patch cord scan is now described, by way of example, with reference to the components of the network scanner shown in FIG. 3. According to examples of the presently disclosed subject matter, the patch cord scan can be initiated by the processing unit 360, for example, according to a predefined scan routine, or in response to a command by an operator of the network scanner 40. By way of example, the computerized instructions associated with the predefined scan routine can be memorized in the memory module 365 and can be executed by the processing unit 360. Further by way of example, the memory module 365 can provide computerized instructions with respect to each scan mode including with respect to the various operation of the various components of the network scanner 40.

Further by way of example, the processing unit 360 can instruct the microcontroller 350 of the control and sensing unit 351 to switch scan-mode activation unit 345 to a patch cord scan mode (if it is not already in this mode).

According to examples of the presently disclosed subject matter, once the network scanner 40 is in the patch cord scan mode, the control and sensing unit 351, or in another example the processing unit 360, is configured to instruct the I/O control unit 355 to select a first port of a first panel (e.g., a patch panel or a cross connect panel) and a second port of a second panel (e.g., a patch panel or a cross connect panel). By way of example, the first and the second ports are selected according to a predefined scan cycle configuration and/or according to an instruction received from an operator of the network scanner 40. The I/O control unit 355 can utilize the I/O interface 305 and any of its components to connect to the first port of the first panel and to the second port of a second panel.

According to examples of the presently disclosed subject matter, in addition to the selection of the panels ports, for each patch cord scan, the network scanner 40, can also be configured to select the pair of wires that to be used for the scan. In some examples, the network scanner 40 can instruct the respective panels which pair of wires is to be used for the scan. According to some examples, the pair of wires to be used can be predetermined, or it can be selected for each scan or from time to time. Further by way of example, the network scanner 40 can select the same pair of wires for the first port and for the second port, and thus the scan signal is injected and collected from the same pair of wire in each of the respective ports. Still further by way of example, the network scanner 40 can select a different same pair of wires for the first port and for the second port, and thus the scan signal is injected into a first pair of wires of the first port and collected from a different pair of wires of the second port. The selection of the wires and the use of the wires in the scan process is further discussed below.

According to examples of the presently disclosed subject matter, once the first and the second ports (and the respective wires) are selected, the controller and sensing unit 351 (e.g., using the sensing unit 340), can be configured, possibly in cooperation with the I/O control unit 355, to cause a scan signal to be injected through a first port of a first panel.

The returned signal corresponding to the scan signal can be collected by the network scanner 40 through a second port of a second panel. For example the sensing unit 340 can be operatively connected to the second port of the second panel, and can be utilized to sense for a returned signal.

According to examples of the presently disclosed subject matter, the scan signal is an analog signal with predefined electrical characteristics. For example, the scan signal can be a DC current signal. Further by way of example, the current level of the scan signal can be predefined. Still further by way of example, the current level of the scan signal can be known (when the scan signal is transmitted).

According to examples of the presently disclosed subject matter, while the network scanner is in the patch cord scan mode, a predefined parameter of the retuned signal can be measured or otherwise evaluated. Further by way of example while the network scanner is in the patch cord scan mode the current level of returned signal can be determined and/or compared with the current level of the scan signal Still further by way of example, an indication of a cable connection or an indication of an absence of a cable connection between the panel port through the scan signal was injected and the panel port through the signal was collected can be determined based on the analysis of the returned signal.

A scenario that demonstrates a possible false outcome of a patch cord scan is illustrated by way of example in FIG. 2. In FIG. 2, as is shown by way of example, PP port 212 is connected (by a patch cord) to CC port 222 and PP port 214 is connected (by a patch cord) to CC port 224. Further by way of example, CC port 222 is connected to switch port 232, and CC port 224 is connected to switch port 234.

As is also shown in FIG. 2, switch port 232 and switch port 234 have a shared common termination 236. A shared common termination is created when a common termination element is shared among two or more ports in a manner that allows, under certain circumstances, for DC current to flow from one port to the other port through the shared common termination. By way of example, some switch manufacturers use shared common termination among switch ports to reduce the cost of the switch, but the considerations for introducing shared common termination in-between switch ports is outside the scope of the current disclosure. In another example, a shared common termination can exist between two remote node ports (which are connected to a patch panel).

In the scenario illustrated in FIG. 2, the network scanner 40 can invoke a patch cord scan between CC port 222 and PP port 214. According to examples of the presently disclosed subject matter, the scanner unit 40 can be connected to the CC port 222 and to the PP port 214. According to examples of the presently disclosed subject matter, each of the PP 10 and the CC 20 can include a port selection unit 860. The port selection units 860 can be configured to enable connection of the network scanner 40 to a selected port of the PP 10 or the CC 20, respectively. According to further examples, the PP 10 and the CC 20 can also be configured to select a pair of wires that is to be used for the scan. The selection of the wire pairs can be according to an instruction from the network scanner 40. In other examples, the wires that are used for the scan are predefined.

As part of a patch cord scan, the network scanner can be configured to inject a scan signal through the CC port 222 and can be configured to attempt to collect the signal through the PP port 214. According to examples of the presently disclosed subject matter, the control and sensing unit 351 can include a sensing unit 340. The sensing unit 340 can be adapted to generate a scan signal. The sensing unit 340 can be configured to sense for a returned signal that corresponds to the scan signal.

According to examples of the presently disclosed subject matter, the scan signal is a DC current signal. Further by way of example, the current level of the scan signal can be predefined. Still further by way of example, the current level of the scan signal can be known (when the scan signal is transmitted). Still further by way of example, the sensing unit 340 can be configured to measure and evaluate a predefined parameter of the returned signal, and based on the measured parameter can generate an indication with regard to a cable connection between the first 222 and the second ports 214 or the lack thereof. Further by way of example, while the network scanner is in the patch cord scan mode the current level of returned signal can be determined and/or compared with the current level of the scan signal. Still further by way of example, an indication of a cable connection or an indication of an absence of a cable connection between the first port 222 through which the scan signal was injected and the second port 214 through which the signal was collected can be based on the analysis of the returned signal, possibly in comparison to the scan signal.

In the scenario illustrated in FIG. 2 the CC port 222 and the PP port 214 are not connected by a cable (a patch cord), and one would expect the patch cord scan to indicate that these two ports are not connected to one another. However, the shared common termination among the switch ports 232 and 234 can lead to misleading or even false results of the patch cord scan. As is shown in FIG. 2, the scan signal can flow from CC port 222 to switch port 232 to which it is connected. The shared common termination 236 creates a signal path from switch port 232 to switch port 234, and the scan signal thus flows from switch port 232 to switch port 234. From switch port 234 the scan signal flows to CC port 224, and from CC port 224 the signal flows, through a patch cord connection, to PP port 214, where the signal is collected. The collected signal is the returned signal of this particular patch cord scan. The returned signal is sensed or otherwise evaluated. Based on the results of the returned signal's evaluation, an indication can be provided as to whether to two ports 222 and 214 are interconnected.

In FIG. 2 there was no cable connection between the port through which the signal was injected (CC port 222) and the port from which the signal was collected (PP port 214). It would have been desirable for the patch cord scan to reflect the absence of a cable connection among these two ports. For example, a false indication regarding a cable connection among the two ports 222 and 214 can create ambiguity, because the false indication can conflict with a true indication (e.g., that port 222 is patched to port 212 and that port 214 is patch to port 224). In the scenario shown in FIG. 2, because the two ports 222 and 214 are not patched (connected by a cable), the scan signal is driven to flow through the shared common termination 234 and ends up at the PP port 214. The signal collected through the PP port 214 appears to be substantially similar to a (hypothetical) signal flowing over a patch cord connection between the ports under examination 222 and 214. For example, signal collected through the PP port 214 can be substantially similar to the signal that was from PP port 212 as part of a patch cord scan among CC port 222 and PP port 212. Because the signal collected as a result of the patch cord scan among ports 222 and 214 is similar to the signal that would have been received if the two ports were directly patched, the network scanner 40 may conclude that the CC port 222 and PP port 214 are patched to one another. In the scenario shown in FIG. 2, such an indication with regard to CC port 222 and PP port 214 would be a false cable connection indication.

It would be appreciated, that a similar false cable connection indication would have occurred in case the shared common termination was among two remote nodes ports, e.g., if there was a shared common termination among remote node ports 262 and 264. In this case, the indication of multiple concurrent patching connections can be in respect of a cross connect panel port and several (two or more) patch panel ports.

Figure 4:
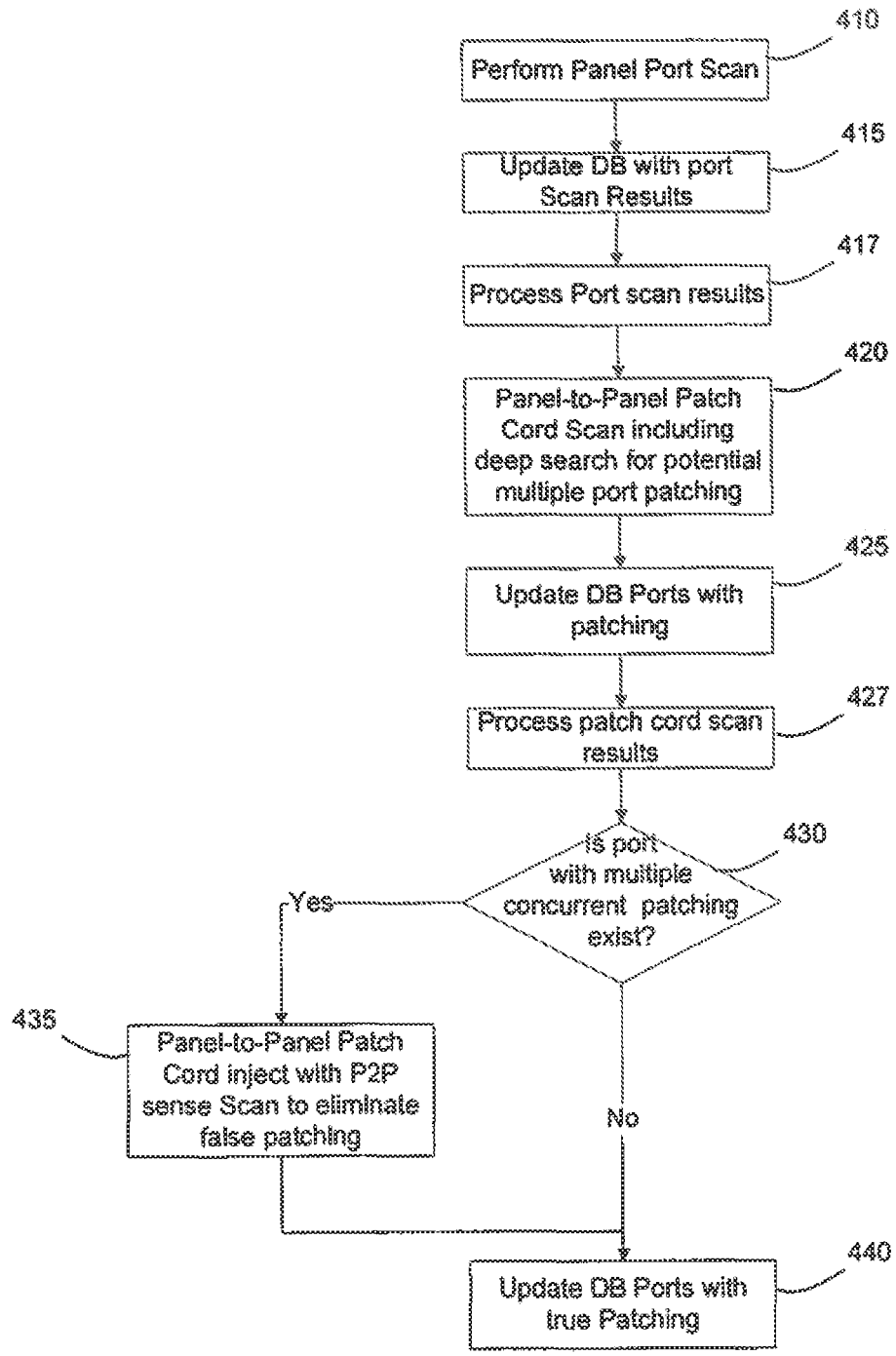
FIG. 4 is a flowchart illustration of a method of identifying a false cable connection indication within a channel, according to examples of the presently disclosed subject matter.

Accordingly, in some examples of the presently disclosed subject matter, in order to eliminate such false cable connection indications, a predefined set of network scans can be implemented by the network scanner 40. Reference is now made to FIG. 4, which is a flowchart illustration of a method of identifying a false cable connection indication within a channel. According to examples of the presently disclosed subject matter, the method of identifying a false cable connection indication within a channel involves in-band scan(s) that are carried out (at least in part) in the physical layer (OSI layer 1) over a non-intervened channel.

According to examples of the presently disclosed subject matter, a predefined set of network scans that are intended for identifying a false cable connection indication within a channel(s) can start with a patch cord scan. Further by way of example, the patch cord scan can be carried out for each one of a plurality of ports of a first panel and with respect to a plurality of ports of a second panel. Thus, for example, for a patch panel having 24 ports and a cross connect panel having 24 ports, the patch cord scan can involve scanning possible patching combinations among the patch panel and cross connect panel ports. For simplicity, a patch panel scan that is implemented as part of a predefined scan cycle and involves scanning a plurality of possible patching connections for each port from a first plurality of ports of a first panel, and between each port from the first plurality of ports and a second plurality of ports of a second panel. Such a scan is referred to herein as a "deep search patch cord scan"

According to one example of the presently disclosed subject matter, a scan cycle for identifying a false cable connection indication within a channel can include a deep search patch cord scan (block 420) and the results of the deep search patch cord scan can be recorded in a database (block 425). By way of example, the database can be implemented as part of the network scanner 40 or on an external server 135 that is operatively the network scanner 40. The results of the various scan that are implemented as part of the predefined scan cycle, and which can be stored on the database, can undergo processing to identify false cables connection indication related to one or more channels within the network 100.

As is shown in FIG. 4, a scan cycle can include a preliminary panel port scan (block 410), and the deep search patch cord scan (block 420) can be configured according to the results of the panel port scan. By way of example, the panel port scan can be used to reduce the number of combinations which need to be scanned in the deep search patch cord scan (block 420). However, according to other examples of the presently disclosed subject matter, the deep search patch cord scan can be implemented independently of a panel port scan and the configuration of the deep search patch cord scan can be unaffected by a panel port scan, in yet further examples of the presently disclosed subject matter, the panel port scan blocks (blocks 410-417) can be omitted altogether from the scan cycle. An example of a panel port scan shall be provided below.

Figure 5:
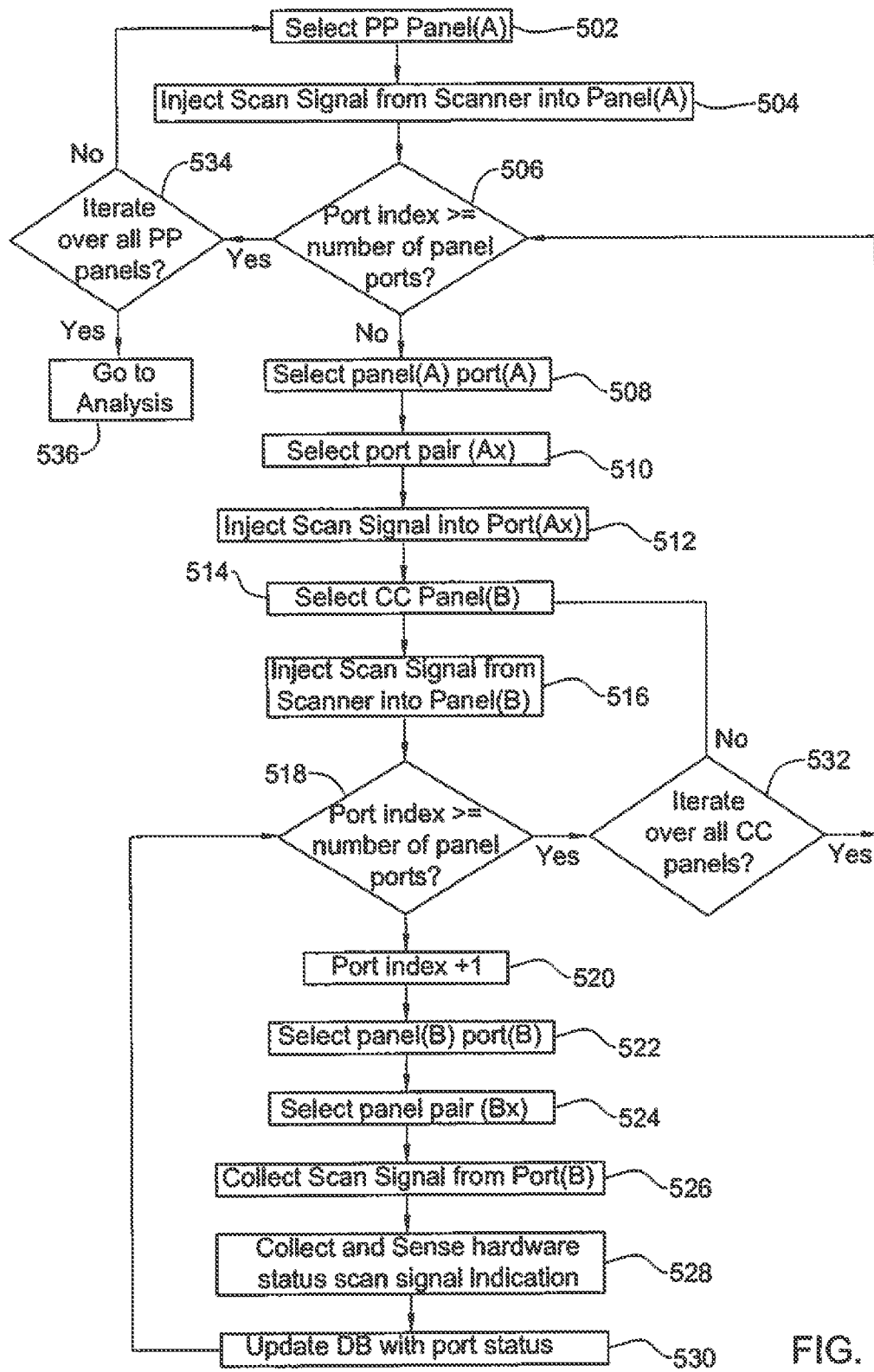
FIG. 5 is a flow chart illustration of a patch cord scan, according to examples of the presently disclosed subject matter.

Reference is now made to FIG. 5, which is a flow chart illustration of a patch cord scan according to examples of the presently disclosed subject matter. The patch cord scan shown in FIG. 5 can be implemented as a deep search patch cord scan. According to examples of the presently disclosed subject matter, a patch cord scan can be used by the network scanner for providing a cable connection indication between a first port of a first panel and second port of a second panel, and in particular for providing cable connection indications with regard to each one of a plurality of ports of first panel and each one of a plurality of ports of a second panel.

According to some examples, the patch cord scan can be implemented for a first plurality of panels at one end and for a second plurality of panels at the other end. In case the possible patching combinations among panels are unknown (e.g., it is unknown which patch panels are connected to which cross connect panels), for each panel from amongst the first plurality of panels (e.g., a plurality of patch panels ports), the patch cord scan can iterate over each panel from amongst the second plurality of panels (e.g., a plurality of cross connect panels).

Accordingly, the network scanner 40 can select from amongst the first plurality of panels a current panel for which the patch cord scan is to be carried out (block 502). A first panel index can be implemented to this end. According to one example, a first panel index can be implemented over the first plurality of panels and can be used to control the application of the patch cord scan with respect to each one of the first plurality of panels and for the selection of the current panel from amongst the first plurality of panels (block 504 and 534).

In a similar manner, a port of the selected first panel is selected (block 506 and 508). As mentioned above, the scans can be carried out over a pair of wires of the twisted pair cable. Accordingly a pair of wires can be selected for the patch cord scan. As was also mentioned above, in some examples of the presently disclosed subject matter, some or all of the scan cycle scans can be carried out over a single wire of the twisted pair cable(s). The wire or wire pair can be predetermined, or can be selected for each scan (e.g., as in block 510), or the wire or wire pair can be selected for a number of scans.

Based on the selection of the first panel, the selected port and the selected wire pair (or single wire) the scan signal is injected (block 512) from the network scanner to the selected first panel, through the selected port of the first panel and over the selected pair of wire (or over the selected single wire).

Following the selection of the first panel, the selected port and the selected wire pair (or single wire), or in parallel, a second panel from among the second plurality of panels can be selected (blocks 514, 516 and 532). A port of the second panel can be selected (blocks 518, 520 and 522), and if necessary (e.g., if not predefined), a wire pair (or a single wire) can also be selected (block 524). Based on the selection of the first panel, the selected port and the selected wire pair (or single wire) the returned signal corresponding to the scan signal can be collected (e.g., from the second panel through the selected port and over the selected wires) (block 526). The collected returned signal can be analyzed (block 528) to determine whether it is indicative of a cable connection between the selected port of the first panel and the selected port of the second panel (and possibly also for the selected wires or wire pairs), and the results of the analysis can be recorded in a database (block 530) or in any other data structure.

Figure 6:
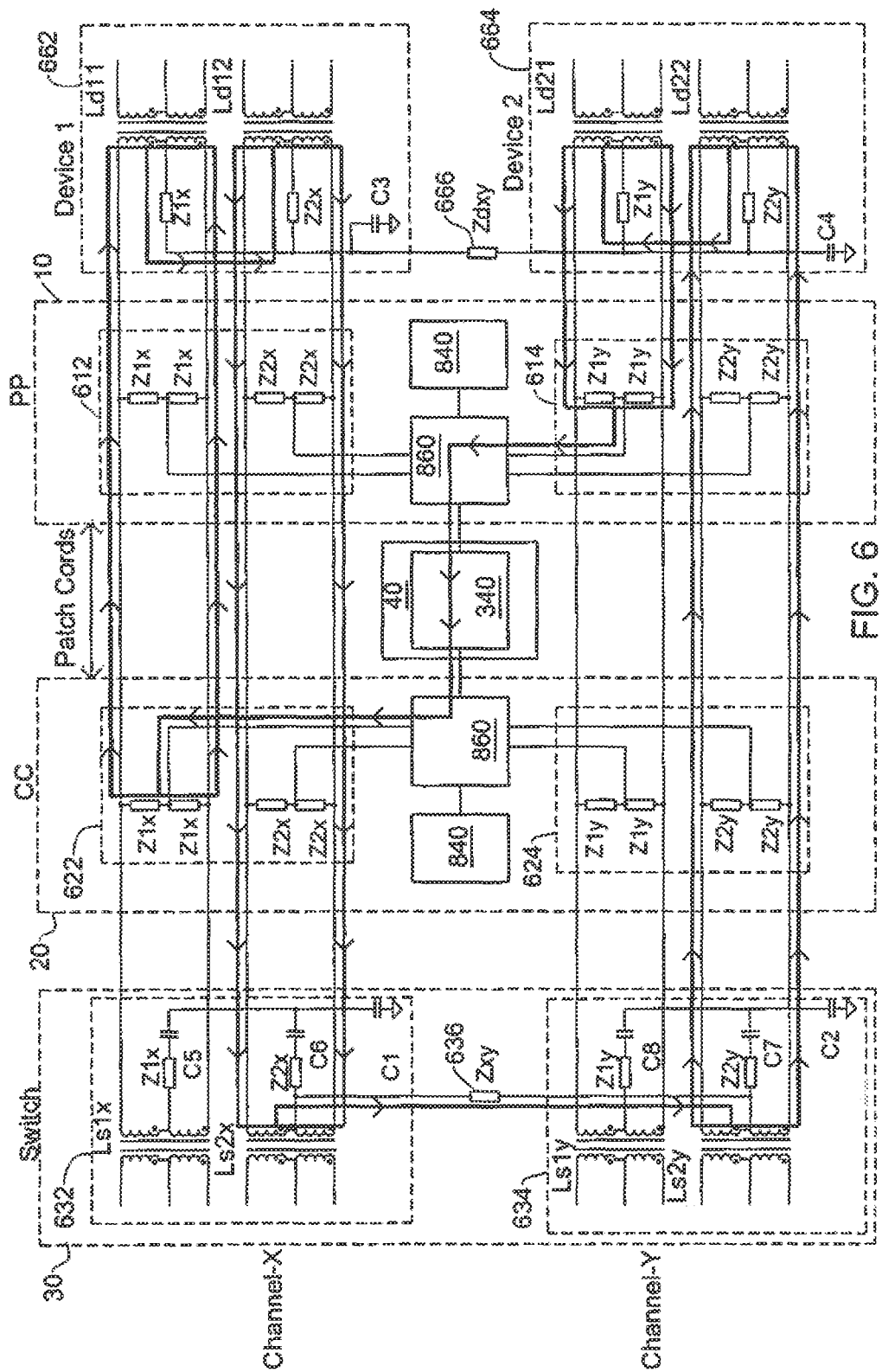
FIG. 6 is a simplified schematic diagram of a segment of the LAN network over which a patch cord scan can be implemented, according to further examples of the presently disclosed subject matter.

An example of a patch cord scan was described above with reference to FIG. 2. The patch cord scan described with reference to FIG. 2 demonstrates a possible patch cord scan that can be implemented as part of the scan cycle shown in FIG. 4, and can be carried out according to the relevant portions of the patch cord scan process illustrated in FIG. 5. Reference is now made to FIG. 6 which is a simplified schematic diagram of a segment of the LAN network over which a patch cord scan can be implemented, according to further examples of the presently disclosed subject matter.

In FIG. 6 by way of example, two ports, namely 612a and 614 of the patch panel 10 are shown. Further by way of example, on one side, the patch panel ports 612a and 614 are connected to respective remote node ports 662 and 664. Each of the remote node ports 662 and 664 is associated with a different (one) remote node. Optionally, the two patch panel ports 612a and 614 are connected to respective remote node ports 662 and 664 through corresponding work area outlet ports (not shown in FIG. 6). On the other side, the patch panel ports 612a and 614 are connected to respective cross connect panel ports 622a and 624. The cross connect panel ports 622a and 624 are connected to the patch panel ports 612a and 614 on one side, and on the other side, the cross connect panel ports 622a and 624 are connected to respective ports 632a and 634 of the switch 30

As is also shown in FIG. 6, switch port 632a and switch port 634 have a shared common termination 634. The shared common termination is over a first wire pair. For illustration, the shared common termination is over wires number 3 and 6 (which constitute a first wire pair). The patch cord scan, for example, between CC port 622a and PP port 614 can be carried out, for example, over a second wire pair. For example, the patch cord scan can be carried out over wires 7 and 8 (which constitute a second wire pair). Based on what was described above, the scan signal that was injected through the switch port 632a over wires 7 and 8 would not cross over to switch port 634, because the shared common termination is among wires 3 and 6 of switch ports 632a and 634.

However, as is shown by way of example, in FIG. 6, the device termination within each of the remote node ports 662 and 664 allows a cross-over current path among wire pairs, and in particular, in the examples shown in FIG. 6, among wire pair 3 and 6 and wire pair 7 and 8.

As a result, for a scan signal injected through wires 7 and 8 of CC port 622a and collected through wires 7 and 8 of PP port 614, the following current path can form: CC port 622a through wires 7 and 8, the scan signal can propagate to remote node port 662, where the device termination would allow the scan signal to cross-over to wires 3 and 6, and because the shared common termination is among wires 3 and 6 of switch ports 632a and 634, the scan signal would flow over wires 3 and 6 from the remote node port 662 through the PP port 612a and the CC port 622a that are interconnected by a patch cord to switch port 632a; from switch port 632a the scan signal proceeds through the shared common termination (over wires 3 and 6) to switch port 634; from switch port 634 the scan signal flows over wires 3 and 6 from the remote node port through the CC port 624 and the PP port 614 that are interconnected by a patch cord; from the PP port 614 the scan signal propagates to remote node port 664, were the device termination would allow the scan signal to cross-over back to wires 7 and 8; and through wires 7 and 8 of the remote node port 664 the signal can propagate to PP port 614 where the scan signal is collected as the returned signal. Thus, a network scanner can falsely conclude that there is a cable connection among CC port 622a and PP port 614 due to the termination sharing among channels at one end and a cross-over current path allowed by a device termination within respective devices at the other end of the channels.

Figure 7:
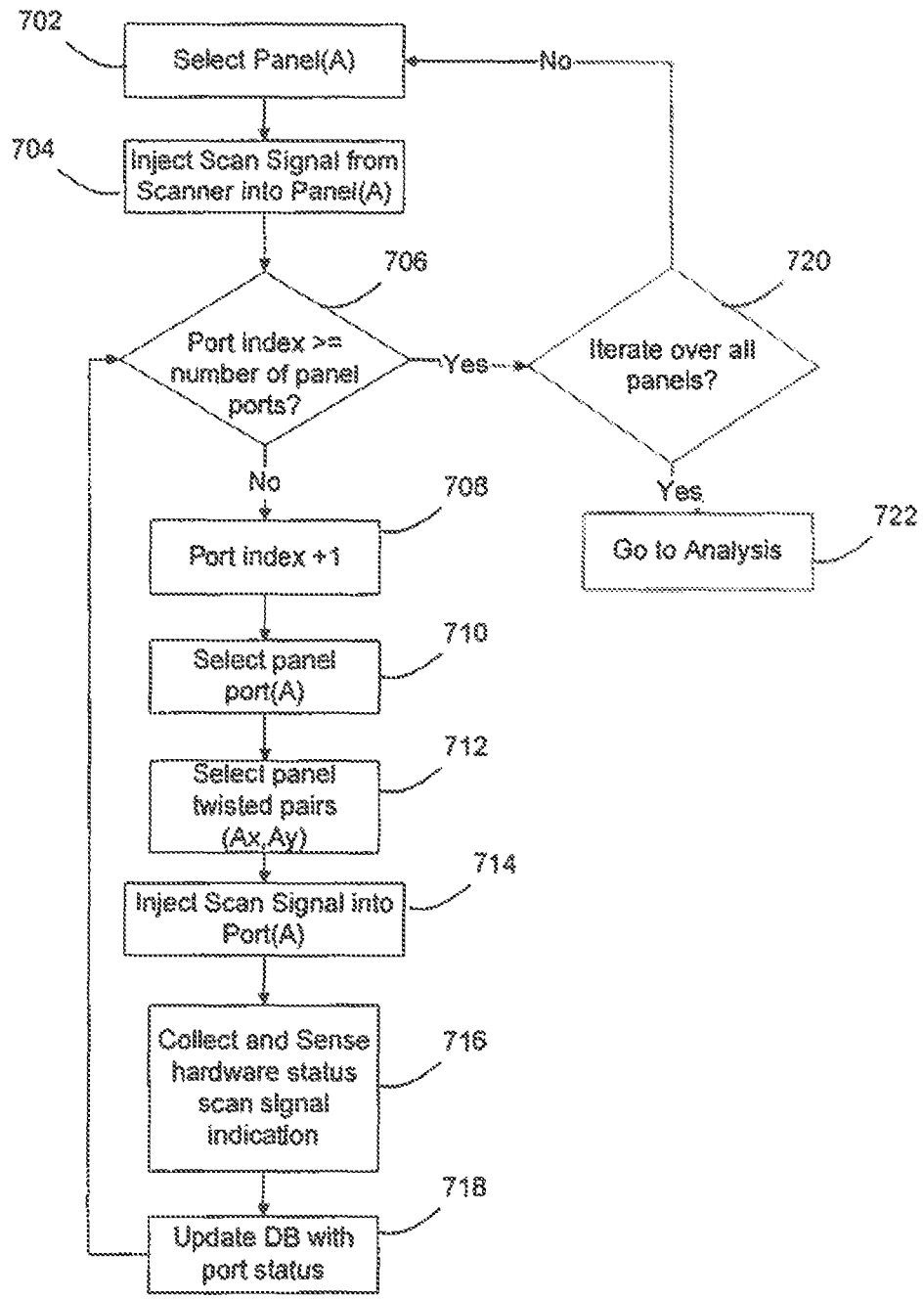
FIG. 7 is a flow chart illustration of a panel port scan according to examples of the presently disclosed subject matter.

As was mentioned above, according to one configuration of a scan cycle for identifying a false cable connection indication within a channel, a panel port scan can be implemented as part of the scan cycle (block 410), for example, prior to the deep search patch cord scan (block 420). A panel port scan shall now be described with reference to FIGS. 7-10. FIG. 7 is a flow chart illustration of a panel port scan according to examples of the presently disclosed subject matter. Additional reference is made to FIG. 8 is a schematic block-diagram illustration of an architecture of a patch panel or of a cross connect panel, according to examples of the presently disclosed subject matter.

Figure 8:
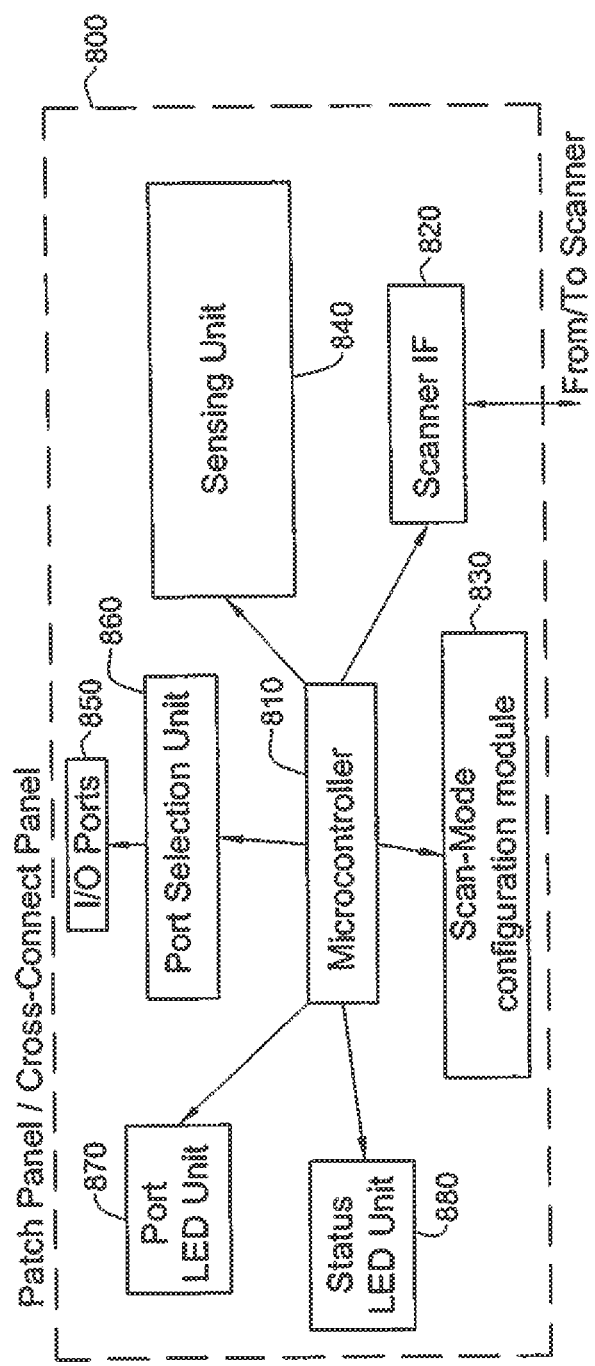
FIG. 8 is a schematic block-diagram illustration of architecture of a patch panel or of a cross connect panel, according to examples of the presently disclosed subject matter.

According to examples of the presently disclosed subject matter, the panel 800 shown in FIG. 8 can be a patch panel or a cross connect panel, and the panel components shown in FIG. 8 can be implemented within a patch panel or a cross connect panel.

According to examples of the presently disclosed subject matter, in addition to the I/O ports 850 of the panel, the panel 800 can include a panel controller 810, a network scanner interface 820 a scan mode configuration module 830 and a port selection module 860, and a sensing unit 840.

The panel controller 810 can be adapted to control the operation of the panel 800 and any of its components. For example, the panel controller 810 can be configured to receive and to process an instruction from the network scanner. The communication with the network scanner can be facilitated by the network scanner interface 820, which can include a transceiver, communication buses any other component which may be required to enable communication with the network scanner.

By way of example, the panel controller 810 can receive an instruction from the network scanner to perform a panel port scan. The panel controller 810 can be responsive to the instruction to perform a panel port scan, for initiating a panel port scan process within the panel 800. Further by way of example, as part of the initiation of the panel port scan process, the panel controller 810 can cause the scan mode configuration module 830 to switch to the panel port scan mode, and can implement the configurations for the panels scan mode, possibly in cooperation with the scan mode configuration module 830. As part of the panel port scan process, the panel controller 810 can utilize the various components of the panel 800 to inject a scan from the network scanner to a selected twisted pair of a selected port and to collect the retuned signal through a different twisted and analyze it, as will now be described.

According to examples of the presently disclosed subject matter, a panel port scan can be implemented for or by a plurality of panels. The panel port scan can begin with a selection of a panel from amongst the plurality of panels for which the panel port scan is to be implemented next (block 702 and 720). Once the panel is selected, the network scanner can be configured to transmit a scan signal to the selected panel, and the selected panel can be configured to receive the scan signal from the network scanner through the network scanner interface 820 (block 704). The scan signal can be a constant DC current and can be directed by the panel through its various ports as part of the panel port scan process, as will now be described.

According to examples of the presently disclosed subject matter, the panel port scan can involve injecting the scan signal through each one of a plurality of ports of the panel that is being scanned. For example, the panel port scan can involve injecting the scan signal through each one (all) of the panel's ports. The network scanner can be configured to monitor the progress of the panel port scan, and can indicate to the panel the sequence by which the ports are to be scanned. Further by way of example, as part of the panel port scan, the network scanner can provide instructions to the panel with respect of one port at a time, and can instruct the panel to move to the next port, and specify the next port after completion of a scan of a previous port. In further examples, as part of the panel port scan, the network scanner can be configured to provide the panel with a batch sequence of the ports to be scanned, and it would not be necessary for the panel to receive instructions from the network scanner to move to the next port nor for the network scanner to specify the next port to be scanned.

As part of the panel port scan, the network scanner can implement an iteration control block to select the next port to be scanned and to control the progress and the termination of the panel port scan with respect to each panel (blocks 706, 708 and 710). For each iteration of the panel port scan, a respective port of the panel can be selected (block 710). Optionally, the network scanner can also select the twisted pair that is to be used for injecting the panel port scan signal and the twisted pair that is to be used for collecting the returned signal (block 712) and can instruct the panel accordingly.

According to examples of the presently disclosed subject matter, based on the instructions from the network scanner, the panel controller 810 can configure the port selection module 860 to allow the scan signal from the network scanner to be injected through the selected twisted pair of the selected panel port (block 714). The panel controller 810 can configure the port selection module 860 to collect a corresponding returned signal through a respective selected twisted pair of the same port (block 716).

According to examples of the presently disclosed subject matter, the port selection module 860 can include a plurality of switches, and the switches can be operated to direct the signal to a selected port, and can be operated to enable collecting of the returned signal from a selected port. Further by way of example, the port selection module 860 can also enable a selection of the twisted pair that is to be used for injecting a signal to a selected port and to enable a selection of the twisted pair that is to be used for collecting a single from a selected port.

Figure 9:
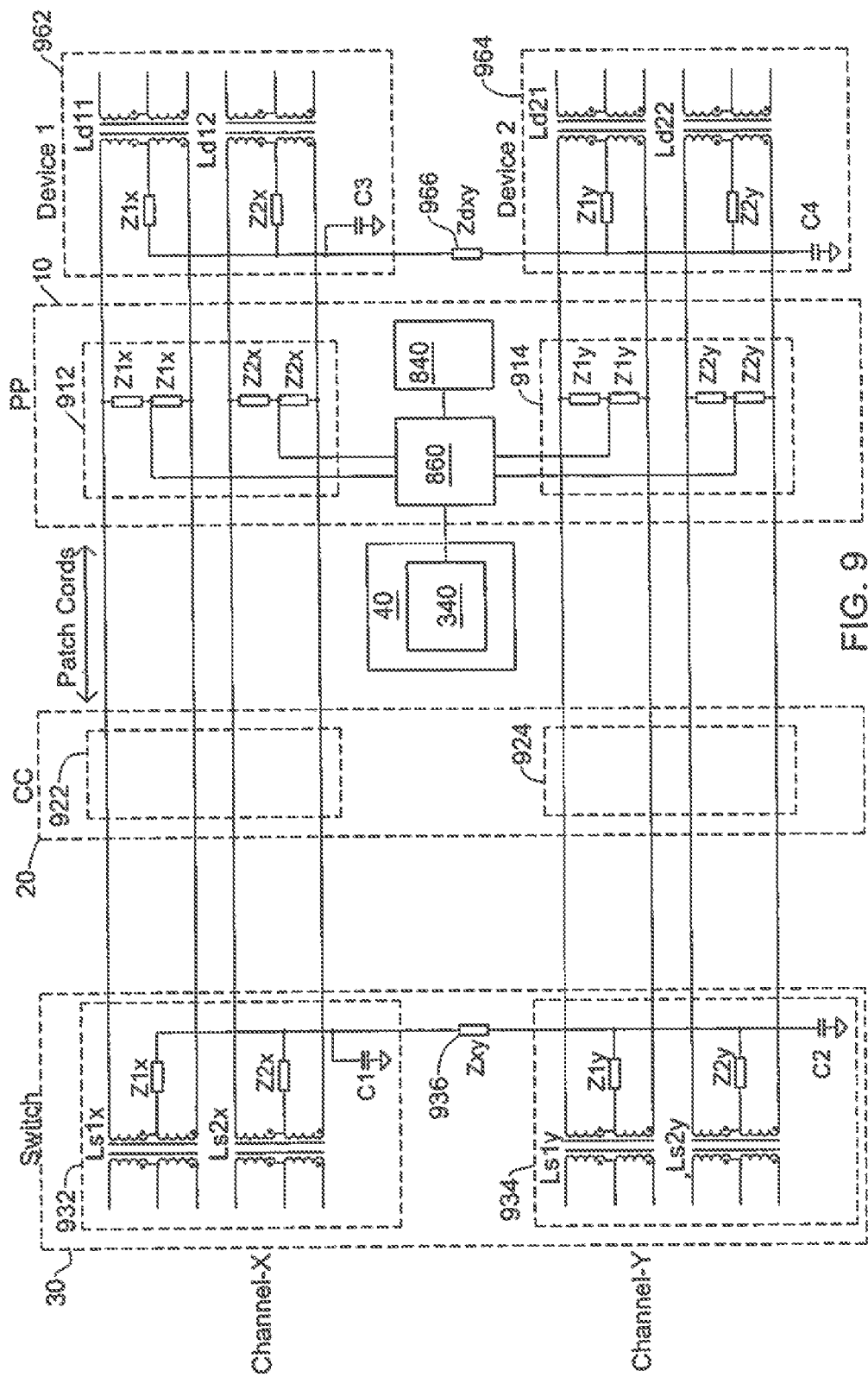
FIG. 9 is a simplified schematic diagram of a segment of a LAN including part of a patch panel with respect of which a panel port scan can be implemented, according to examples of the presently disclosed subject matter.

Reference is now made to FIG. 9, which is a simplified schematic diagram of a segment of a LAN including part of a patch panel with respect of which a panel port scan can be implemented, according to examples of the presently disclosed subject matter. According to examples of the presently disclosed subject matter, in FIG. 9 there are shown a network scanner 40 and a patch panel 10 that are operatively connected to one another. Two ports 912 and 914 of the PP are shown as an example. The first PP port 912 is operatively connected to remote node 962 and the second PP port 914 is operatively connected to remote node 964. Also shown are two switch ports 932 and 934, PP ports 912 can be connected to switch port 932 and PP port 914 can be connected to the switch port 934. The PP ports can be connected to the switch ports through a cross connect panel. In some examples of the presently disclosed subject matter, the PP ports can be connected directly to the switch ports. The latter configuration is discussed below.

As part of the panel port scan, the PP 10 can be configured, according to an appropriate instruction from the network scanner 40, to inject a scan signal through the PP port 912. The scan signal can be injected over a first twisted pair, for example, the twisted pair over which the signal is injected can be selected according to an appropriate instruction in this regard from the network scanner 40.

The scan signal injected through the PP port 912 would propagate over the respective channel, which the PP port 912 is part of. In this regard, it would be appreciated that since the channels are non-intervened channel, in the case of the channel which PP port 912 is part of, the scan signal would propagate in both directions, i.e., towards the respective remote node port 962 and toward the respective switch port 932, since both are connected to the same channel as the PP port 912.

The remote node port 962 provides a termination point for the channel which the scanned PP port 912 is part of. The termination of the remote node port 962 can allow the DC current to flow back to the PP port 912 and the overall detected impedance in this case would be relatively low, compared to case where the PP port is not connected to a recognizable terminated end point. It would be appreciated that according to examples of the presently disclosed subject matter, the scan signal can be transmitted to the remote node port 962 over a first twisted pair, and the returned signal can propagate back to the PP port 912 over a second twisted pair. The sensing unit 840 can be configured to detect a connection to a recognizable terminated end point, for example, based on the DC current level of the returned signal, and the corresponding impedance level, compared to the scan signal.

It would be appreciated, in case the channel which the PP port 912 is part of is terminated at the switch port 932, the current level of the signal returned signal that is received at the PP 912 from the switch port 932, can indicate that the channel which the PP port 912 is part of, is connected to or includes a recognizable terminated end point. It would also be appreciated, the indication of a recognizable terminated end point which can be received as a result of a connection between PP port 912 and switch port 932 (possibly through a respective CC panel port) would be received at the PP 10, whether the channel is also terminated on the other side at a remote device port 962 or not.

On the other hand, when the channel which the scanned PP port 912 is part of does include a recognizable terminated end point, such as a remote node port or a switch port, there is no path for the scan signal to return to the PP port 912, and thus, the impedance level would be relatively high, and the current level (if any) of the returned signal would be relatively low, in particular compared to the current level that would typically be received if the channel included a recognizable terminated end point.

The returned signal, or data with respect to the returned signal can be recorded in a database (block 718). The database update block is also shown in FIG. 4 and is marked there as block 415. According to examples of the presently disclosed subject matter, the database can be located at the network scanner 40, and thus, the panel's controller 810, based on results of a sense performed by the sensing unit 840, can be configured to forward data with respect to the returned signal (using the network scanner interface 820) to the network scanner 40. The network scanner 40 can be configured to process the results of the panel port scan (block 417), and can determine based on the results of the panel port scan, which ports of a panel are part of a channel that includes a recognizable terminated end point.

According to examples of the presently disclosed subject matter, the panel port scan can be applied to a plurality of panels which are associated with the network scanner 40.

Figure 10:
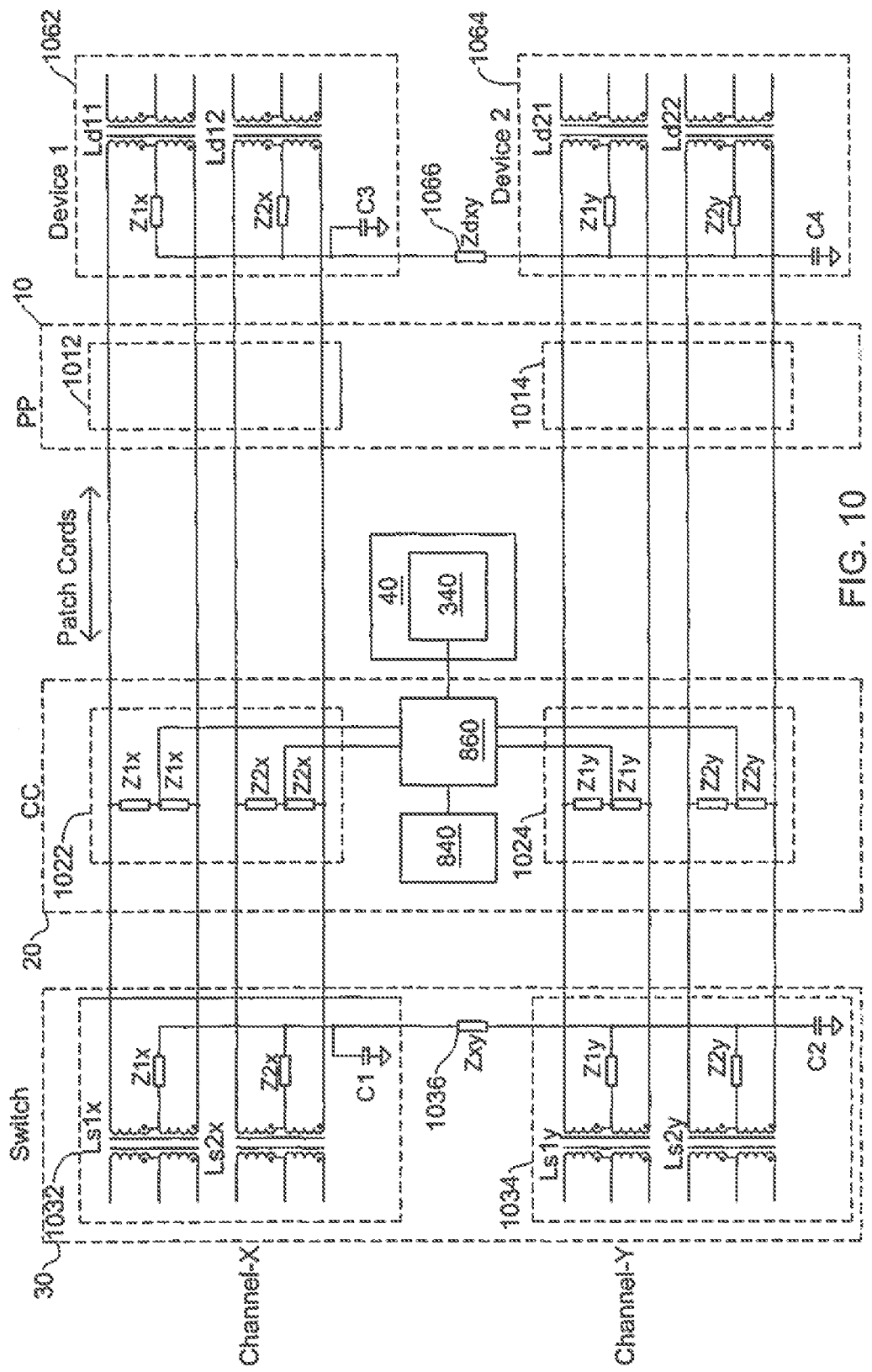
FIG. 10 is a simplified schematic diagram of a segment of a LAN including part of a cross connect panel with respect of which a panel port scan can be implemented, according to examples of the presently disclosed subject matter.

Reference is now made to FIG. 10, which is a simplified schematic diagram of a segment of a LAN including part of a cross connect panel with respect of which a panel port scan can be implemented, according to examples of the presently disclosed subject matter. According to examples of the presently disclosed subject matter, in FIG. 10 there are shown a network scanner 40 and a cross connect panel 20 that are operatively connected to one another. Two ports 1022 and 1024 of the CC panel are shown as an example. The first CC port 1022 is operatively connected to switch port 1032 and the second CC port 1024 is operatively connected to switch port 1034. Also shown are two PP ports 1012 and 1014. CC port 1022 can be connected to remote node port 1062 and CC port 1024 can be connected to the remote node port 1064. The CC ports can be connected to the remote node ports through patch panel ports. In some examples of the presently disclosed subject matter, the remote node ports can be connected directly to the CC panel ports.

According to examples of the presently disclosed subject matter, the implementation of the panel port scan with respect to the CC panel 20 can be substantially equivalent to the implementation of the panel port scan with respect to the PP panel 10, which was described above, mutatis mutandis.

Referring now back to FIG. 4, as was mentioned above, according to examples of the presently disclosed subject matter, the panel port scan (blocks 410-417) can be implemented prior to the deep search patch cord scan (block 420), and the deep search patch cord scan can be configured according to the results of the panel port scan. For example, the deep search patch cord scan can be implemented only for panel ports with respect to which the panel port scan results indicate connection to a recognizable terminated end point. As was discussed above, a false cable connection indication can result from a shared common termination among two or more ports of end points (e.g, switch ports or remote devices ports). Thus, according to examples of the presently disclosed subject matter, the network scanner 40 can be configured to streamline the deep search patch cord scan to include only panel ports for which the panel port scan results indicate connection to a recognizable terminated end point, because typically a recognizable terminated end point is a (non-exclusive) condition for a shared common termination which in turn can be a cause of a false cable connection indication.

According to examples of the presently disclosed subject matter, following the deep search patch cord scan (block 420), and optionally after the recordation of the scan results (block 425), the network scanner 40 can be configured to process the results of the deep search patch cord scan (block 427) to determine for which of the panel's (or panels') ports, that were scanned as part of the deep search patch cord scan, an indication(s) of multiple concurrent patchings to ports of another panel (or to ports of other panels) were received.

For example, referring back to FIG. 2, for PP port 214, a panel port scan can indicate that this port is connected to a recognizable terminated end point, and a deep search patch cord scan can result in an indication for PP port 214 of multiple concurrent patchings, for example, between PP port 214 and CC port 222, and between PP port 214 and CC port 224. As mentioned above, in the scenario illustrated by FIG. 2, the indication for PP port 214 of multiple concurrent patching can result from the shared common termination among switch port 232 and 234, which are connected to CC ports 222 and 224, respectively.

Returning now to the description of FIG. 4, now that the panel ports for which there is an indication of multiple concurrent patching connections are identified, the scan cycle can resume to implement a further scan (or scans) in respect of the panel ports for which an indication of multiple concurrent patching connections was received, in order to ascertain which (one or more) of the indications is false. According to examples of the presently disclosed subject matter, the scan cycle shown in FIG. 4 can include implementing a panel-to-panel patch cord with port-to-port scan to ascertain which (one or more) of the indications are false (block 435). A control block can be implemented to restrict the panel-to-panel patch cord with port-to-port scan to ports for which an indication of multiple concurrent patching connections was received at as result of the patch cord scan (block 430). It would be appreciated that the control block (block 430) is optional and can be used to avoid unnecessary scans.

Accordingly, for panel ports for which there is an indication (e.g., received as a result of the patch cord scan) of a single patching connection, or of no patching connections, the scan cycle shown in FIG. 4 can proceed directly to block 440, and for these panel ports the results database, were the final patching results are recorded, can be updated to indicate the (single) patching connection associated with that panel port, or the lack of patching connection associated with that port, whichever is appropriate of that particular port.

As mentioned above, in some examples of the presently disclosed subject matter, the panel port scan (block 410 in FIG. 4) is optional, and can be used to restrict the subsequent scans which are part of the scan cycle (e.g., the scan cycle shown in FIG. 4) to panel ports which are connected to a recognizable terminated end point. It would also be appreciated, that in some examples of the presently disclosed subject matter, the patch cord scan (block 420 in FIG. 4) is optional, and can be used to restrict the subsequent scans which are part of the scan cycle (e.g., the scan cycle shown in FIG. 4) to panel ports for which the patch panel scan indicates multiple concurrent patching connections. Thus, according to examples of the presently disclosed subject matter, the scan cycle shown in FIG. 4 can be implemented without one of the panel port scan and the patch cord scan, and in further examples, can be implemented without either one of the panel port scan and the patch cord scan. According to further examples of the presently disclosed subject matter, the indications which the panel port scan and the patch cord scan (of both these scans or of either one of these scans) can be provided manually as input from an operator of the system, through appropriate interfaces.

As mentioned above, a scan cycle, according to examples of the presently disclosed subject matter, can include a panel-to-panel patch cord with port-to-port scan (block 435) which can be applied with respect of panel ports for which an indication of multiple concurrent patching connections was received. The panel-to-panel patch cord with port-to-port scan, according to examples of the presently disclosed subject matter, is now described.

For convenience, in order to simplify the description of the panel-to-panel patch cord with port-to-port scan, a port-to-port scan shall be described first. It would be appreciated that a port-to-port scan is, according to examples of the presently disclosed subject matter, is not in-and-of-itself a scan that is implemented as part of the scan cycle shown in FIG. 4. The port-to-port scan is only implemented in the scan cycle shown in FIG. 4 as part of the panel-to-panel patch cord with port-to-port scan, and the description of the port-to-port scan provided now should be regarded as a first part of the description of the complete panel-to-panel patch cord with port-to-port scan. It would be appreciated, that in other scan cycles which can be implemented according to examples of the presently disclosed subject matter for determining false indications regarding a cable connections within a channel, a port-to-port scan can be implemented as an independent scan, as will be discussed below.

Figure 11:
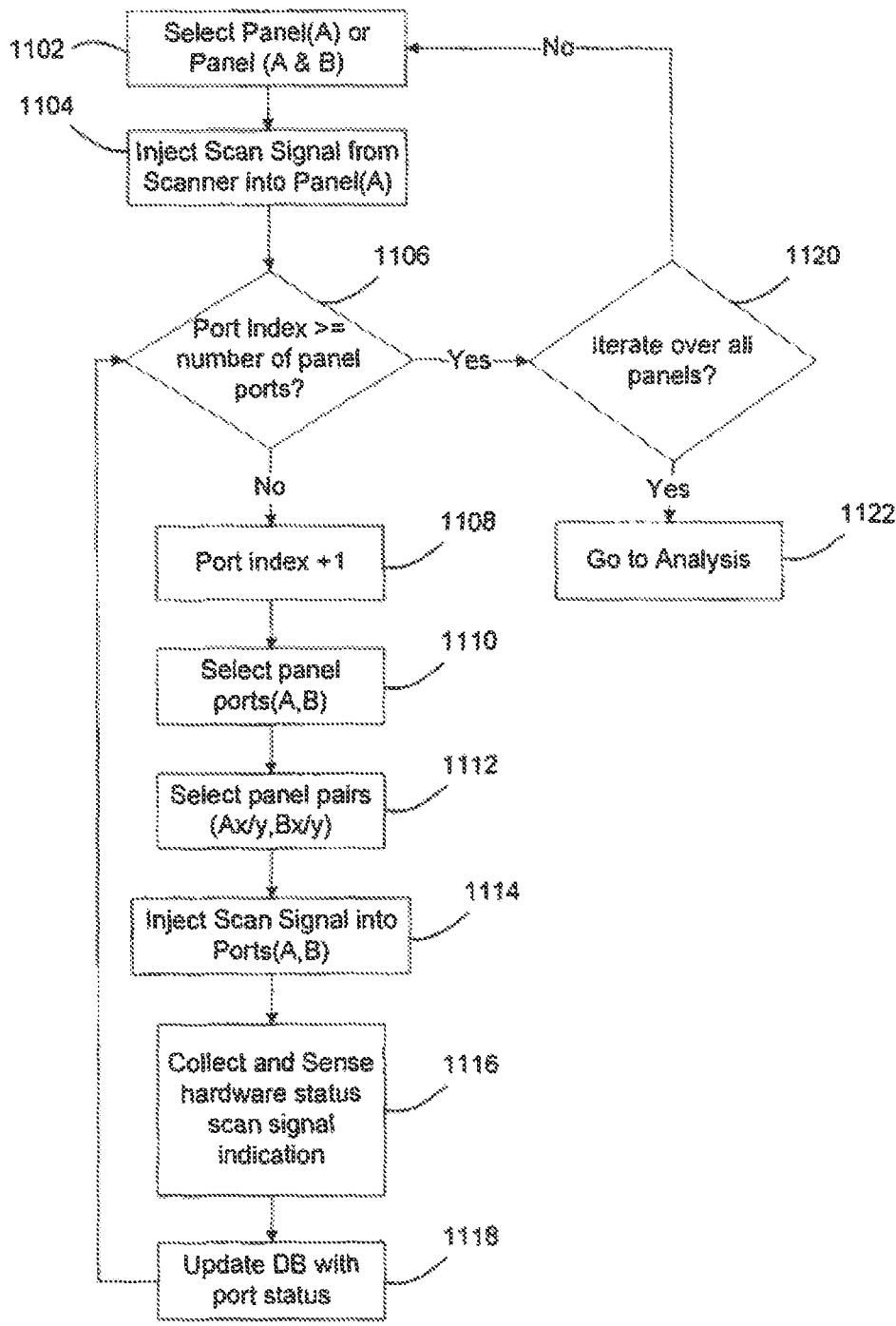
FIG. 11 is a flow chart illustration of a port-to-port scan according to examples of the presently disclosed subject matter.

Reference is now made to FIG. 11, which is a flow chart illustration of a port-to-port scan according to examples of the presently disclosed subject matter. Additional reference is made to FIG. 8 and to FIG. 9, which were presented above. A port-to-port scan according to examples of the presently disclosed subject matter can begin with a selection of the panel or pair of panels to which the port-to-port scan is to be applied (block 1102). The selected panel can be one of a predefined group of panels consisting of a plurality panels, and the panel can be selected by the network scanner 40 from the group. In case a pair of panels is selected, the selected panels are any pair of panels from a predefined group consisting of a plurality of panels sharing substantially the same general function within the LAN.

Once the panel is selected, the network scanner 40 can be configured to transmit a scan signal to the selected panel, and the selected panel can be configured to receive the scan signal from the network scanner 40 through the network scanner interface 820 (block 1104). The scan signal can be a constant DC current and can be directed by the panel through its various ports as part of the port-to-port scan process, as will now be described.

According to examples of the presently disclosed subject matter, the port-to-port scan can involve injecting the scan signal through each one of a first plurality of ports of the panel that is being scanned, and for each port through which the scan signal is injected (i.e., one of the first plurality of ports), the port-to-port scan can include sensing for a corresponding returned signal through each one of a second plurality of ports of a panel. According to examples of the presently disclosed subject matter, the ports from the second plurality of ports are ports of the same panel as the first plurality of ports. According to other examples of the presently disclosed subject matter, the ports from the second plurality of ports include ports of a different panel as the first plurality of ports.

For example, the port-to-port scan can involve injecting a scan signal and sensing for a corresponding returned signal for all possible port combinations of the selected panel. In other examples of the presently disclosed subject matter, the port-to-port scan can involve injecting a scan signal through each one of a plurality of ports of the selected panel, and sensing for a corresponding returned signal according to all possible port combinations, including combinations with ports of other panels, which within the LAN, serve substantially the same general function as the selected panel. For example, in case the scanned port is a port of a select patch panel, as part of a port-to-port scan, each one of a selected PP's (or a selected CC's) ports can be scanned in combination with each of the other ports of the same panel, and possibly in combination with the ports of each of the other patch panels (or the other CC panels).

The network scanner 40 can be configured to monitor the progress of the port-to-port scan, and can indicate to the selected panel the sequence by which the ports are to be scanned. If the port-to-port scan involves sensing of ports of other panels (i.e., port of panels other than the selected panel), the network scanner 40 can be responsible for synchronizing the operation of the different panels in this regard.

As part of the port-to-port scan, the network scanner 40 can be configured to select the next port through which the scan signal is to be injected and the next port that is to be sensed for the corresponding returned signal (block 1110). To this end, the network scanner 40 can implement an iteration control block to determine which is the next port through which the scan signal is to be injected, and to determine which is the next port that is to be sensed for the corresponding returned signal, as necessary (block 1108).

According to examples of the presently disclosed subject matter, in addition to selecting a panel port through which the scan signal is to be injected and a panel port which shall be sensed for a returned signal corresponding to the scan signal, a pair of wires can be selected in associated with each of the panel ports (block 1112). Thus, for example, a first pair of wires can be selected in association with the panel port through which the scan signal is to be injected, and the scan signal can be injected through the selected wire pair of the selected port. Similarly, the pair of wires selected in association with the panel port that are the pair of wires that are to be used for sensing for a returned signal. It would be appreciated that in examples of the presently disclosed subject matter, the wire pairs are predefined and there is no need to select the wire pairs that are to be used.

Once the injection panel port and the sensed panel port, and possibly the wire pairs of each port, are selected, the respective panel can be configured to inject the scan signal from the network scanner 40 to the selected injection panel port, and if applicable through the selected wire pair. The injection of a scan signal through a selected injection panel port, and if applicable through the selected wire pair was described above (block 1114). Likewise, the panel which includes the sensed panel port can be configured to sense the selected sensed panel port for detecting a returned signal corresponding to the scan (block 1116). If applicable, the selected wire pair of the sensed panel port is used for sensing for the returned signal.

According to examples of the presently disclosed subject matter, based on the indication with regard to a receipt of returned signal corresponding to the scan signal through the selected sensed panel port (and if applicable through the selected wire pair), or the lack thereof, the network scanner 40 determine the existence or absence of a shared common termination among the selected injection panel port and the selected sensed panel port (and if applicable among the selected or predefined wire pairs). Further by way of example, in case a returned signal corresponding to the scan signal is detected through the selected sensed panel port (and if applicable through the selected wire pair), the network scanner 40 can conclude that the injection panel port and the sensed panel port are connected to respective non-isolated ports of network elements that have a shared common termination. If no retuned signal is detected through the sensed panel port, the network scanner 40 can conclude that the network elements ports to which the injection panel port and the sensed panel port are connected do not have a shared common termination. This includes the case where a signal is detected when sensing the sensed panel port, but it is determined that the detected signal does not correspond to the scan signal. It would be appreciated that in case the injection and sensing operations are carried out over or through selected wire pairs, the conclusions with regard to the existence or absence of a shared common termination among the selected injection panel port and the selected sensed panel port relate to selected wire pairs only. The network scanner 40 can be configured to record an indication with regard to the existence or absence of a shared common termination among a selected injection panel port and a selected sensed panel port (and if applicable among selected or predefined wire pairs) in a database or in any other appropriate data structure (block 1118).

As mentioned above, according to examples of the presently disclosed subject matter, the panel port-to-port scan is not necessary (although it can be optional), as such, as part of the scan cycle illustrated in FIG. 4. Rather, according to examples of the presently disclosed subject matter, as part of a scan cycle for detecting false cable connection indications between a first port of a first panel and ports of one or more other panels, a scan which is a combination of panel-to-panel patch cord inject and a panel port-to-port sense scan can be implemented, as will now be described.

Figure 12:
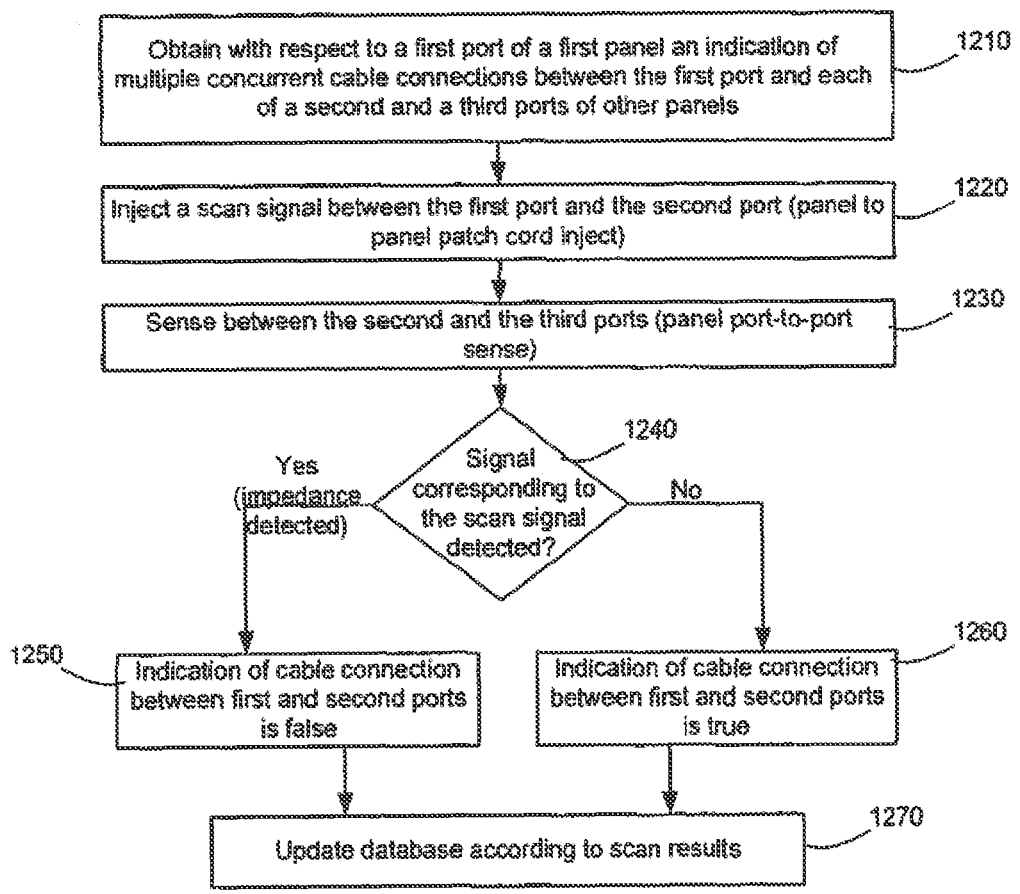
FIG. 12 is a flowchart illustration of a panel-to-panel patch cord inject with a panel port-to-port sense scan, according to examples of the presently disclosed subject matter.

Reference is now made to FIG. 12, which is a flowchart illustration of a panel-to-panel patch cord inject with a panel port-to-port sense scan, according to examples of the presently disclosed subject matter. As mentioned above, according to examples of the presently disclosed subject matter, a panel-to-panel patch cord inject with a panel port-to-port sense scan can be implemented as part of a scan cycle for detecting false cable connection indications between a first port of a first panel and ports of one or more other panels. While, according to some examples of the presently disclosed subject matter, a scan cycle for detecting false cable connection indications between a first port of a first panel and ports of one or more other panels can be implemented without the panel port-to-port scan and even without the panel-to-panel patch cord scan, the panel-to-panel patch cord inject and a panel port-to-port sense scan can be regarded as a combination of a sequence (one or more) of operations described above in connection with injecting a scan signal according to a panel-to-panel patch cord scan, and a sequence (one or more) of operations described above in connection with sensing for a returned signal (corresponding to a scan signal) according to a panel port-to-port scan, and the details of these sequences of operations shall not be repeated.

According to examples of the presently disclosed subject matter, an indication with respect to multiple concurrent cable connections between a first port of a first panel and each of a second port and a third port of other panels can be obtained (block 1210). Further according to examples of the presently disclosed subject matter, the indication with respect to multiple concurrent cable connections between the first port of the first panel and each of the second and third ports of the other panels can be provided as a manual input or as part of preceding scans implemented as part of a scan cycle, such as the panel port scan (block 410) and the panel-to-panel patch cord scan (block 420).

Following receipt of the indication with respect to multiple concurrent cable connections between a first port of a first panel and each of a second and a third ports of other panels, and based on this indication, the processing unit 360 can instruct the scan-mode activation unit 345 to switch the network scanner 40 to a panel-to-panel patch cord inject with a panel port-to-port sense scan mode. The network scanner 40 can also be configured to instruct the first panel and each of the other panels associated with ports for which there is an indication of a cable connection with the first port, to switch to a panel-to-panel patch cord inject with a panel port-to-port sense scan mode.

Following the switch to the panel-to-panel patch cord inject with a panel port-to-port sense scan mode, the network scanner 40 can be configured to inject a scan signal to the first panel. The network scanner can be configured to instruct the first panel, which the first port is part of, to inject the scan signal through the first port. The network scanner 40 can be configured to instruct a second panel, which the second port is part of, to collect (although not necessarily sense) the corresponding returned signal (block 1220). For example, as part of injecting the scan signal between the first and the second ports, the network scanner 40 can try to establish an electrical circuit between the first and the second ports. It would be appreciated that that an electrical circuit between the first and the second ports can exist either through a direct circuit whose path extends from the first port to the second port over a direct patch cable connection between the first and the second ports and back through the network scanner, or through an indirect circuit, which involves a current path from the first port to the third port, over a direct cable connection between the first and the third ports, from the third port to the shared common termination to the second port and from the second port back through the network scanner.

As will be explained below, the network scanner, or the panels, responsible for the port-to-port sense part of the scan, can detect as a result of the port-to-port sense that the current did not flow through the direct circuit from the first port to the second port (over a direct patch cable connection) and back through the network scanner, but rather through a different (indirect) current path.

Substantially concurrently with the injection of the scan signal between the first and the second ports, the panel or panels which the second and the third ports are part of or the network scanner 40 can sense between the second and the third ports for a returned signal corresponding to the scan signal (block 1230). For example, as part of sensing for a returned signal between the second and the third ports, the panel or panels which the second and the third ports are part of, together with the panel which the first port is part of and the network scanner, can try to establish an electrical circuit between the first and the second ports which includes a current path between the second and the third ports and, assuming that a cable connection between the first and the second ports (and across the respective panels) does not exist, and instead, assuming that a cable connection between the first and the third ports (and across the respective panels) exists. In other words, the sense between the second and the third ports would detect a returned signal corresponding to the scan signal, if there is a substantial current flow over the shared common termination between the second and the third ports. It would be appreciated that when the scan signal is inject between the first and the second ports, a substantial current flow over the shared common termination between the second and the third ports would occur only if there is not a direct circuit whose path extends from the first port to the second port over a direct patch cable connection between the first and the second ports and back through the network scanner.

It would be appreciated that according to examples of the presently disclosed subject matter, when a scan signal is injected between a first port of a first panel and a second port of a second panel, substantial current can flow through a current path created by a common termination shared between the second and the third ports can be sensed when there is no direct cable connection between the first and the second ports. In this regard, it would be further appreciated, that according to examples of the presently disclosed subject matter, if there is a direct cable connection between the first and the second ports, substantially all of the scan signal current would flow within the electrical circuit created by the direct cable connection between the first and the second ports and back through the network scanner 40, and substantially no current would flow through the current path created by the shared common termination between the second and the third ports.

It would be appreciated, that even if the first and the second ports are directly connected by a true cable connection, trace amounts of current which corresponds to the scan signal injected between the first and the second ports may still be detected between the second and the third ports. However, such trace amounts of current would be relatively small compared to the current flow over a direct cable connection between the first and second ports, and the network scanner, or the relevant panels, can use a threshold or any other filtering component to disregard such trace amounts of current.

Accordingly, the network scanner 40 can receive the results of the panel-to-panel patch cord inject with a panel port-to-port sense scan with respect to the first port and the second and third ports, and can process the results to determine whether an indication of a cable connection between the first and the second ports is true or false. According to examples of the presently disclosed subject matter, the network scanner 40 can check whether a substantial current which corresponds to the scan signal that was injected between the first and the second ports was detected between the second and third ports (block 1240). If such substantial current was detected the network scanner 40 can conclude that the indication of a cable connection between the first and the second ports is false (block 1250), and if no substantial current was detected the network scanner 40 can conclude that the indication of a cable connection between the first and the second ports is true (block 1260). In this regard, it would be noted that as mentioned above, substantial current which corresponds to a signal that was injected between the first and the second ports would flow through a current path created by a shared common termination among the second and the third ports if, and only if, there is no direct cable connection between the first and the second ports.

The network scanner 40 can record the results of the panel-to-panel patch cord inject with a panel port-to-port sense scan, for example, in a database (block 1270).

An example of an implementation of the panel-to-panel patch cord inject with a panel port-to-port sense scan is now described by way of with reference to the network components shown in FIG. 2. As was described above, In FIG. 2, by way of example, at one side of the patch panel 10, the patch panel ports 212 and 214 are connected to respective remote node ports 262 and 264. Each of the remote node ports 262 and 264 is associated with a different (one) remote node. On the other side of the patch panel 10, the patch panel ports 212 and 214 are connected to respective cross connect panel ports 222 and 224. The cross connect panel ports 222 and 224 are connected to the patch panel ports 212 and 214 on one side of the cross connect panel 20, and on the other side, the cross connect panel ports 222 and 224 are connected to respective ports 232 and 234 of switch 30.

For the sake illustration, it is assumed that with respect to panel port 214 an indication is received of multiple concurrent cable connections between patch panel port 214 and at least cross connect ports 222 and 224. This indication can be a result of a preceding panel-to-panel patch cord scan, which due to a shared common termination 236 among the switch ports 232 and 234, resulted in respective multiple concurrent patching connection indications for patch panel port 214. However, in other examples, the indication of multiple concurrent patching connections can be provided as input and in some examples the panel-to-panel patch cord scan is omitted from the scan cycle.

Irrespective of the source of the multiple concurrent patching connections indications for patch panel port 214, the network scanner 40 can implement a panel-to-panel patch cord inject with a panel port-to-port sense scan with respect to patch panel port 214 and cross connect ports 222 and 224 to determine which of the patch connection indications is false.

As an example, as was mentioned above, it is assumed that the true patch cable connection is between patch panel port 214 and cross connect port 224, and the indication of a patch cable connection between patch panel port 214 and cross connect port 222 is false.

As part of the panel-to-panel patch cord inject with a panel port-to-port sense scan, the network scanner 40 can inject a scan signal between the patch panel port 214 and the cross connect port 222. The cross connect panel 20 (or the network scanner 40) can sense between the cross connect ports 222 and 224 for a returned signal corresponding to the scan signal. It would be appreciated that since there is not a direct cable connection between patch panel port 214 cross connect port 222, the scan signal would flow over the patch cable connection between patch panel port 214 and cross connect port 224 and from cross connect port 224 a returned signal corresponding to the scan signal would flow to the switch ports 234 connected to cross connect port 224. From switch port 234 the signal would flow through the shared common termination 236 to switch port 232. From switch port 232 the returned signal would flow to cross connect port 222 to which the switch port 232 is connected. From cross connect port 222 the returned signal is collected back to the network scanner 40. Further as part of the panel-to-panel patch cord inject with a panel port-to-port sense scan, the cross connect panel 20 can be configured to sense between cross connect ports 222 and 224, and would detect the returned signal (which corresponds to the scan signal), since as mentioned above, the signal would propagate over the current path created between cross connect ports 222 and 224 through the shared termination 236 between the switch ports 232 and 234 to which the cross connect ports 222 and 224 are connected.

The indication of the sensed signal between cross connect ports 222 and 224 can be provided to the network scanner 40. Based on the indication of the sensed signal between cross connect ports 222 and 224, the network scanner 40 can conclude the indication of cable connection between patch panel port 214 and cross connect port 222 is false.

Furthermore, according to examples of the presently disclosed subject matter, assuming that at least one of the cable connection indications with respect any port is true, if there is only one remaining cable connection indication which was not determined to be false, the network scanner 40 can conclude that the remaining cable connection indication. For example, if the cable connection indications are a result of a panel-to-panel patch cord scan, and the false indications are the result of a shared common termination among two or more ports, it can be assumed that at least one of a plurality of concurrent cable connection indications related to a single port is true. However, it would be appreciated that according to other examples of the presently disclosed subject matter, including in the case where panel-to-panel patch cord scan is implemented as part of the scan cycle, the panel-to-panel patch cord inject with a panel port-to-port sense scan for a certain port can be resumed until one of the scan results in a positive indication of a true cable connection.

Figure 13:
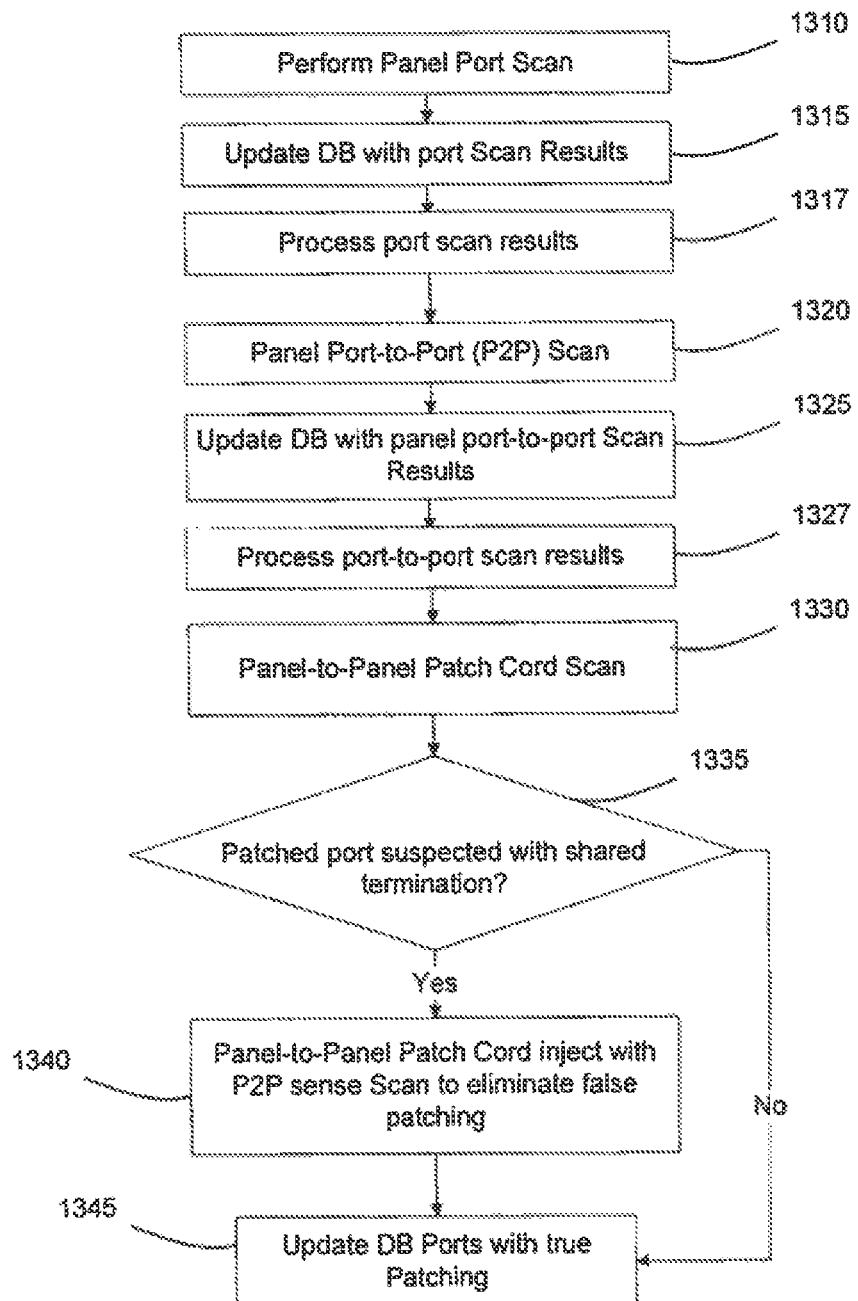
FIG. 13 is a flowchart illustration of a method of identifying a false cable connection indication within a channel, according to further examples of the presently disclosed subject matter.

Another example of a scan cycle implementation is shown in FIG. 13, which is a flowchart illustration of a method of identifying a false cable connection indication within a channel, according to further examples of the presently disclosed subject matter. According to examples of the presently disclosed subject matter, the method of identifying a false cable connection indication within a channel involves in-band scan(s) that are carried out (at least in part) in the physical layer (OSI layer 1) over a non-intervened channel.

According to examples of the presently disclosed subject matter, a predefined set of network scans that are intended for identifying a false cable connection indication within a channel(s) can start with a patch cord scan. Further by way of example, the patch cord scan can be carried out for each one of a plurality of ports of a first panel and with respect to a plurality of ports of a second panel.

As is shown in FIG. 13, a scan cycle can include a preliminary panel port scan (block 1310), and a preliminary panel port-to-port scan (block 1320) and the patch cord scan search (block 1330) can be configured according to the results of the panel port scan and according to the results of the panel port-to-port scan. By way of example, the panel port scan and the panel port-to-port scan can be used to reduce the number of combinations which need to be scanned in the patch cord scan search (block 1330). However, according to other examples of the presently disclosed subject matter, the patch cord scan search can be implemented independently of a panel port scan and of a panel port-to-port scan and the configuration of the patch cord scan search can be unaffected by a panel port scan and by a panel port-to-port scan. In yet further examples of the presently disclosed subject matter, the panel port scan blocks (blocks 1310-1317) and the panel port-to-port scan (blocks 1320-1327) can be omitted altogether from the scan cycle.

As was mentioned above, according to examples of the presently disclosed subject matter, the panel port scan (blocks 1310-1317) and the panel port-to-port scan (blocks 1320-1327) can be implemented prior to the patch cord scan search (block 1330), and the patch cord scan search can be configured according to the results of the panel port scan. For example, the patch cord scan search can be implemented only for panel ports with respect to which the panel port scan results indicate connection to a recognizable terminated end point. As was discussed above, a false cable connection indication can result from a shared common termination among two or more ports of end points (e.g., switch ports or remote devices ports). Thus, according to examples of the presently disclosed subject matter, the network scanner 40 can be configured to streamline the patch cord scan search to include only panel ports for which the panel port scan results indicate connection to a recognizable terminated end point, because typically a recognizable terminated end point is a (non-exclusive) condition for a shared common termination which in turn can be a cause of a false cable connection indication.

According to examples of the presently disclosed subject matter, following the panel port-to-port scan (block 1320), and optionally after the recordation of the scan results (block 1325), the network scanner 40 can be configured to process the results of the panel port-to-port scan (block 1327) to determine for which of the panel's (or panels') ports, that were scanned as part of the panel port-to-port scan, an indication(s) of non-isolated ports of network elements that have a shared common termination were received.

Now that the panel ports for which there is an indication of non-isolated ports are identified, the scan cycle can resume to implement a further scan (or scans) in respect of the panel ports for which of non-isolated ports was received, in order to ascertain which (one or more) of the cable connection indications is false. According to examples of the presently disclosed subject matter, the scan cycle shown in FIG. 13 can include implementing a panel-to-panel patch cord with port-to-port scan to ascertain which (one or more) of the indications are false (block 1340). A control block can be implemented to restrict the panel-to-panel patch cord with port-to-port scan to ports for which an indication of non-isolated ports was received at as result of the panel port-to-port scan (block 1320). It would be appreciated that the control block (block 1335) is optional and can be used to avoid unnecessary scans.

Accordingly, patch cord scan result (block 1330), for panel ports for which there is no indication of shared common termination (e.g., received as a result of the panel port-to-port scan), of a single patching connection, or of no patching connections, the scan cycle shown in FIG. 13 can proceed directly to (block 1345), and for these panel ports the results database, were the final patching results are recorded, can be updated to indicate the (single) patching connection associated with that panel port, or the lack of patching connection associated with that port, whichever is appropriate of that particular port.

As mentioned above, in some examples of the presently disclosed subject matter, the panel port scan (block 1310 in FIG. 13) is optional, and can be used to restrict the subsequent scans which are part of the scan cycle (e.g., the scan cycle shown in FIG. 13) to panel ports which are connected to a recognizable terminated end point. It would also be appreciated, that in some examples of the presently disclosed subject matter, the panel port-to-port scan (block 1320) in FIG. 13 is optional, and can be used to restrict the subsequent scans which are part of the scan cycle (e.g., the scan cycle shown in FIG. 13) to panel ports for which the panel port-to-port scan indicates non-isolated ports of network elements that have a shared common termination. Thus, according to examples of the presently disclosed subject matter, the scan cycle shown in FIG. 13 can be implemented without one of the panel port scan and the panel port-to-port scan, and in further examples, can be implemented without either one of the panel port scan and the panel port-to-port scan. According to further examples of the presently disclosed subject matter, the indications which the panel port scan and the panel port-to-port scan (of both these scans or of either one of these scans) can be provided manually as input from an operator of the system, through appropriate interfaces.

As mentioned above, a scan cycle, according to examples of the presently disclosed subject matter, can include a panel-to-panel patch cord with port-to-port scan (block 1340) which can be applied with respect of panel ports for which an indication of shared common termination was received.

The invention claimed is:

1. A method of analyzing patching among a first port of a first panel and ports of one or more other panels, comprising:
obtaining with respect to the first port of the first panel an indication of multiple concurrent patchings between the first port and each of two or more different ports of other panels, the two or more different ports including at least a second port and a third port;

injecting a scan signal between the first port and the second port and sensing for a corresponding returned signal between the second and the third ports;

determining that an indication of a patching between the first port and the second port is false when a returned signal corresponding to the scan signal is detected between the second and the third ports.

2. The method according to claim 1, wherein:
said obtaining comprises, obtaining with respect to the first port of the first panel an indication of multiple concurrent patchings between the first port and each of a second, a third and a fourth ports of other panel(s);
said injecting comprises:
a first injecting operation comprising injecting a scan signal through the first port and collecting a respective returned signal through the second port or vice-versa, and concurrently sensing for a corresponding impeded signal between the second and the third ports or between the second and the fourth ports,
and a second injecting operating comprising injecting a scan signal through the first port and collecting a respective returned signal through the third port or vice-versa, and concurrently sensing for a corresponding impeded signal between the third and the second ports or between the third and the fourth ports;
said determining comprises, determining that an indication of a patching between the first port and the second port, and an indication of a patching between the first port and the third port are false, when for said first injecting an impeded signal corresponding to the scan signal is detected between the second and the third ports or between the second and the fourth ports, and for said second injecting an impeded signal corresponding to the scan signal is detected between the third and the second ports or between the third and the fourth ports, respectively.

3. The method according to claim 2, wherein determining that an indication of a patching between the first port and the second port is true when for said first injecting substantially no signal corresponding to the scan signal is sensed between the second and the third ports or between the second and the fourth ports.

4. The method according to claim 2, wherein determining that an indication of a patching between the first port and the third port is true when for said second injecting substantially no signal corresponding to the scan signal is sensed between the third and the second ports or between the third and the fourth ports, respectively.

5. A method of analyzing patching among a first port of a first panel and ports of one or more other panels, comprising:
obtaining an indication of a non-isolated shared common termination between two or more ports of a first panel, the two or more ports including at least a first port and a second port;
obtaining an indication of a patching among a third port of a second panel and at least one of said first or second ports of the first panel, and while injecting a scan signal through the third port and collecting a respective returned signal through the first port or vice-versa, sensing between the first and the second ports for a corresponding impeded signal; and
determining that an indication of a patching between the third port and the first port is false when an impeded signal corresponding to the scan signal is detected between the first and the second ports.

6. The method according to claim 5, further comprising determining that an indication of a patching between the first port and the second port is true when substantially no signal corresponding to the scan signal is sensed between the second and the third ports.

7. The method according to claim 5, wherein said obtaining comprises injecting a scan signal through the second port and collecting a respective returned signal through the third port or vice-versa, and sensing for an impeded signal between the second and third ports that is indicative of a shared non-isolated termination.

8. The method according to claim 5, wherein said obtaining comprises injecting a scan signal through the second port and collecting a respective returned signal through each port of the same panel, and sensing for an impeded signal between the first port and each of the other ports of the same panel, and determining that there is a shared non-isolated termination between the first port and another port of the same panel when an impeded signal is sensed between the first port and the other port of the same panel.

9. The method according to claim 5, wherein said obtaining comprises injecting a scan signal through the first port and sensing for a respective returned signal through at least the second port, and in case the respective returned signal is collected through the second port, generating an indication of multiple concurrent patchings between the first port and each of the second port and the third ports.

10. The method according to claim 8, wherein said obtaining comprises injecting a scan signal through the first port and sensing for a respective returned signal through at least the second port, and in case the respective returned signal is collected through the second port, generating an indication of multiple concurrent patchings between the first port and each of the second, third and fourth ports.

11. The method according to claim 9, wherein said obtaining comprises injecting the scan signal through the first port and sensing for a respective returned signal through a plurality of ports of one or more other panels, and in case the respective returned signal is collected through two or more ports of the other panel(s), generating an indication of multiple concurrent patchings between the first port and the two or more ports of the other panel(s) through which the returned signal was collected.

12. The method according to claim 5, wherein said injecting comprises injecting the scan signal through one or more twisted pairs from among the standard 4 twisted pairs of RJ-45 ports.

13. The method according to claim 5, wherein said obtaining comprises sensing for the retuned signal through one or more twisted pairs from among the standard 4 twisted pairs of RJ-45 ports.

14. A network scanner for analyzing patching among a first port of a first panel and ports of one or more other panels, comprising:
a processing unit having an indication of multiple concurrent patchings between a first port and each of two or more different ports of other panels, the two or more different ports including at least a second port and a third port; and
a control and sensing unit adapted to inject a scan signal between the first port and the second port, and adapted to sense for a corresponding returned signal between the second and the third ports; and
said processing unit is configured to determine that an indication of a patching between the first port and the second port is false when a returned signal corresponding to the scan signal is detected between the second and the third ports.

15. The network scanner according to claim 14, wherein:
the processing unit has with respect to the first port of the first panel an indication of multiple concurrent patchings between the first port and each of a second, a third and a fourth ports of other panel(s);
said control and sensing unit is adapted to implement:
a first inject operation comprising injecting a scan signal through the first port and collecting a respective returned signal through the second port or vice-versa, and concurrently sensing for a corresponding impeded signal between the second and the third ports or between the second and the fourth ports,
and a second inject operating comprising injecting a scan signal through the first port and collecting a respective returned signal through the third port or vice-versa, and concurrently sensing for a corresponding impeded signal between the third and the second ports or between the third and the fourth ports;
said processing unit is adapted to determine that an indication of a patching between the first port and the second port, and an indication of a patching between the first port and the third port are false, when for said first inject operating an impeded signal corresponding to the scan signal is detected between the second and the third ports or between the second and the fourth ports, and for said second inject operation an impeded signal corresponding to the scan signal is detected between the third and the second ports or between the third and the fourth ports, respectively.

16. The network scanner according to claim 15, wherein said processing unit is adapted to determine that an indication of a patching between the first port and the second port is true when for said first inject operation substantially no signal corresponding to the scan signal is sensed is between the second and the third ports or between the second and the fourth ports.

17. The network scanner according to claim 15, wherein said processing unit is adapted to determine that an indication of a patching between the first port and the third port is true when for said second inject operation substantially no signal corresponding to the scan signal is sensed between the third and the second ports or between the third and the fourth ports, respectively.

18. A network scanner for analyzing patching among a first port of a first panel and ports of one or more other panels, comprising:
a processing unit having an indication of a non-isolated shared common termination between two or more ports of a first panel, the two or more ports including at least a first port and a second port;
a control and sensing unit adapted to inject a scan signal through a third port and collect a respective returned signal through the first port or vice-versa, and concurrently sense between the first and the second ports for a corresponding impeded signal; and
said processing unit is configured to determine that an Indication of a patching between the third port and the first port is false when an impeded signal corresponding to the scan signal is detected between the first and the second ports.

19. The network scanner according to claim 18, wherein said processing unit is adapted to determine that an indication of a patching between the first port and the second port is true when substantially no signal corresponding to the scan signal is sensed between the second and the third ports.

20. The network scanner according to claim 18, wherein said control and sensing unit is adapted to:
inject a scan signal through the second port;
collect a respective returned signal through the third port or vice-versa;
and sense for an impeded signal between the second and third ports that is indicative of a shared non-isolated termination.

21. The network scanner according to claim 18, wherein said control and sensing unit is adapted to:
inject a scan signal through the second port;
collect a respective returned signal through the third port or vice-versa;
and sense for an impeded signal between the second and third ports that is indicative of a shared non-isolated termination.

22. The network scanner according to claim 18, wherein said control and sensing unit is adapted to:
inject a scan signal through the second port;
collect a respective returned signal through each port of the same panel;
sense for an impeded signal between the first port and each of the other ports of the same panel; and
determine that there is a shared non-isolated termination between the first port and another port of the same panel when an impeded signal is sensed between the first port and the other port of the same panel.

23. The network scanner according to claim 22, wherein said control and sensing unit is configured to:
inject a scan signal through the first port;
sense for a respective returned signal through at least the second port; and
in case the respective returned signal is collected through the second port, generate an indication of multiple concurrent patchings between the first port and each of the second port and the third ports.

24. The network scanner according to claim 22, wherein said control and sensing unit is configured to:
inject a scan signal through the first port;
sense for a respective returned signal through at least the second port; and
in case the respective returned signal is collected through the second port, generate an indication of multiple concurrent patchings between the first port and each of the second, third and fourth ports.

25. The network scanner according to claim 18, wherein said control and sensing unit is configured to:
inject the scan signal through the first port;
sense for a respective returned signal through a plurality of ports of one or more other panels; and
in case the respective returned signal is collected through two or more ports of the other panel(s), generate an indication of multiple concurrent patchings between the first port and the two or more ports of the other panel(s) through which the returned signal was collected.

26. The network scanner according to claim 18, wherein said control and sensing unit is adapted to inject the scan signal through one or more twisted pairs from among the standard 4 twisted pairs of RJ-45 ports.

27. The network scanner according to claim 18, wherein said control and sensing unit is adapted to sense for the returned signal through one or more twisted pairs from among the standard 4 twisted pairs of RJ-45 ports.

28. A computer network, comprising:
a first panel;
one or more panels other than the first panel;
a network scanner having an indication of multiple concurrent patchings between a first port and each of two or more different ports of other panels, the two or more different ports including at least a second port and a third port;
said network scanner is adapted to inject a scan signal between the first port and the second port, and adapted to sense for a corresponding returned signal between the second and the third ports; and
said network scanner is configured to determine that an indication of a patching between the first port and the second port is false when a returned signal corresponding to the scan signal is detected between the second and the third ports.

29. The computer network according to claim 28, wherein:
the network scanner has with respect to the first port of the first panel an indication of multiple concurrent patchings between the first port and each of a second, a third and a fourth ports of other panel(s);
said network scanner is adapted to implement:
a first inject operation comprising injecting a scan signal through the first port and collecting a respective returned signal through the second port or vice-versa, and concurrently sensing for a corresponding impeded signal between the second and the third ports or between the second and the fourth ports,
and a second inject operating comprising injecting a scan signal through the first port and collecting a respective returned signal through the third port or vice-versa, and concurrently sensing for a corresponding impeded signal between the third and the second ports or between the third and the fourth ports;
said network scanner is adapted to determine that an indication of a patching between the first port and the second port, and an indication of a patching between the first port and the third port are false, when for said first inject operating an impeded signal corresponding to the scan signal is detected between the second and the third ports or between the second and the fourth ports, and for said second inject operation an impeded signal corresponding to the scan signal is detected between the third and the second ports or between the third and the fourth ports, respectively.

30. The computer network according to claim 29, wherein said network scanner is adapted to determine that an indication of a patching between the first port and the second port is true when for said first inject operation substantially no signal corresponding to the scan signal is sensed is between the second and the third ports or between the second and the fourth ports.

31. The computer network according to claim 29, wherein said network scanner is adapted to determine that an indication of a patching between the first port and the third port is true when for said second inject operation substantially no signal corresponding to the scan signal is sensed between the third and the second ports or between the third and the fourth ports, respectively.

32. A computer network, comprising:
a first panel;
one or more panels other than the first panel;
a network scanner having an indication of a non-isolated shared common termination between two or more ports of the first panel, the two or more ports including at least a first port and a second port;
said network scanner is adapted to inject a scan signal through a third port and collect a respective returned signal through the first port or vice-versa, and concurrently sense between the first and the second ports for a corresponding impeded signal; and
said network scanner is configured to determine that an indication of a patching between the third port and the first port is false when an impeded signal corresponding to the scan signal is detected between the first and the second ports.

33. The computer network according to claim 32, wherein said network scanner is adapted to determine that an indication of a patching between the first port and the second port is true when substantially no signal corresponding to the scan signal is sensed between the second and the third ports.

34. The computer network according to claim 32, wherein said network scanner is adapted to:
inject a scan signal through the second port;
collect a respective returned signal through the third port or vice-versa;
and sense for an impeded signal between the second and third ports that is indicative of a shared non-isolated termination.

35. The computer network according to claim 32, wherein said network scanner is adapted to:
inject a scan signal through the second port;
collect a respective returned signal through the third port or vice-versa;
and sense for an impeded signal between the second and third ports that is indicative of a shared non-isolated termination.

36. The computer network according to claim 32, wherein said network scanner is adapted to:
inject a scan signal through the second port;
collect a respective returned signal through each port of the same panel;
sense for an impeded signal between the first port and each of the other ports of the same panel; and
determine that there is a shared non-isolated termination between the first port and another port of the same panel when an impeded signal is sensed between the first port and the other port of the same panel.

37. The computer network according to claim 36, wherein said network scanner is configured to:
inject a scan signal through the first port;
sense for a respective returned signal through at least the second port; and
in case the respective returned signal is collected through the second port, generate an indication of multiple concurrent patchings between the first port and each of the second port and the third ports.

38. The computer network according to claim 36, wherein said network scanner is configured to:
inject a scan signal through the first port;
sense for a respective returned signal through at least the second port; and
in case the respective returned signal is collected through the second port, generate an indication of multiple concurrent patchings between the first port and each of the second, third and fourth ports.

39. The computer network according to claim 32, wherein said network scanner is configured to:
inject the scan signal through the first port;
sense for a respective returned signal through a plurality of ports of one or more other panels; and in case the respective returned signal is collected through two or more ports of the other panel(s), generate an indication of multiple concurrent patchings between the first port and the two or more ports of the other panel(s) through which the returned signal was collected.

40. The computer network according to claim 32, wherein said network scanner is adapted to inject the scan signal through one or more twisted pairs from among the standard 4 twisted pairs of RJ-45 ports.

41. The computer network according to claim 31, wherein said network scanner is adapted to sense for the returned signal through one or more twisted pairs from among the standard 4 twisted pairs of RJ-45 ports.

42. The method according to claim 1, further comprising determining that an indication of a patching between the first port and the second port is true when substantially no signal corresponding to the scan signal is sensed between the second and the third ports.

43. The method according to claim 1, wherein said obtaining comprises injecting a scan signal through the second port and collecting a respective returned signal through the third port or vice-versa, and sensing for an impeded signal between the second and third ports that is indicative of a shared non-isolated termination.

44. The method according to claim 1, wherein said obtaining comprises injecting a scan signal through the second port and collecting a respective returned signal through each port of the same panel, and sensing for an impeded signal between the first port and each of the other ports of the same panel, and determining that there is a shared non-isolated termination between the first port and another port of the same panel when an impeded signal is sensed between the first port and the other port of the same panel.

45. The method according to claim 1, wherein said obtaining comprises injecting a scan signal through the first port and sensing for a respective returned signal through at least the second port, and in case the respective returned signal is collected through the second port, generating an indication of multiple concurrent patchings between the first port and each of the second port and the third ports.

46. The method according to claim 44, wherein said obtaining comprises injecting a scan signal through the first port and sensing for a respective returned signal through at least the second port, and in case the respective returned signal is collected through the second port, generating an indication of multiple concurrent patchings between the first port and each of the second, third and fourth ports.

47. The method according to claim 45, wherein said obtaining comprises injecting the scan signal through the first port and sensing for a respective returned signal through a plurality of ports of one or more other panels, and in case the respective returned signal is collected through two or more ports of the other panel(s), generating an indication of multiple concurrent patchings between the first port and the two or more ports of the other panel(s) through which the returned signal was collected.

48. The method according to claim 1, wherein said injecting comprises injecting the scan signal through one or more twisted pairs from among the standard 4 twisted pairs of RJ-45 ports.

49. The method according to claim 1, wherein said obtaining comprises sensing for the retuned signal through one or more twisted pairs from among the standard 4 twisted pairs of RJ-45 ports.

50. The network scanner according to claim 14, wherein said processing unit is adapted to determine that an indication of a patching between the first port and the second port is true when substantially no signal corresponding to the scan signal is sensed between the second and the third ports.

51. The network scanner according to claim 14, wherein said control and sensing unit is adapted to:
inject a scan signal through the second port;
collect a respective returned signal through the third port or vice-versa;
and sense for an impeded signal between the second and third ports that is indicative of a shared non-isolated termination.

52. The network scanner according to claim 14, wherein said control and sensing unit is adapted to:
inject a scan signal through the second port;
collect a respective returned signal through the third port or vice-versa;
and sense for an impeded signal between the second and third ports that is indicative of a shared non-isolated termination.

53. The network scanner according to claim 14, wherein said control and sensing unit is adapted to:
inject a scan signal through the second port;
collect a respective returned signal through each port of the same panel;
sense for an impeded signal between the first port and each of the other ports of the same panel; and
determine that there is a shared non-isolated termination between the first port and another port of the same panel when an impeded signal is sensed between the first port and the other port of the same panel.

54. The network scanner according to claim 53, wherein said control and sensing unit is configured to:
inject a scan signal through the first port;
sense for a respective returned signal through at least the second port; and
in case the respective returned signal is collected through the second port, generate an indication of multiple concurrent patchings between the first port and each of the second port and the third ports.

55. The network scanner according to claim 53, wherein said control and sensing unit is configured to:
inject a scan signal through the first port;
sense for a respective returned signal through at least the second port; and
in case the respective returned signal is collected through the second port, generate an indication of multiple concurrent patchings between the first port and each of the second, third and fourth ports.

56. The network scanner according to claim 14 wherein said control and sensing unit is configured to:
inject the scan signal through the first port;
sense for a respective returned signal through a plurality of ports of one or more other panels; and
in case the respective returned signal is collected through two or more ports of the other panel(s), generate an indication of multiple concurrent patchings between the first port and the two or more ports of the other panel(s) through which the returned signal was collected.

57. The network scanner according to claim 14, wherein said control and sensing unit is adapted to inject the scan signal through one or more twisted pairs from among the standard 4 twisted pairs of RJ-45 ports.

58. The network scanner according to claim 14, wherein said control and sensing unit is adapted to sense for the returned signal through one or more twisted pairs from among the standard 4 twisted pairs of RJ-45 ports.

59. The computer network according to claim 28, wherein said network scanner is adapted to determine that an indication of a patching between the first port and the second port is true when substantially no signal corresponding to the scan signal is sensed between the second and the third ports.

60. The computer network according to claim 28, wherein said network scanner is adapted to:
  inject a scan signal through the second port;
  collect a respective returned signal through the third port or vice-versa;
  and sense for an Impeded signal between the second and third ports that is indicative of a shared non-isolated termination.

61. The computer network according to claim 28, wherein said network scanner is adapted to:
  inject a scan signal through the second port;
  collect a respective returned signal through the third port or vice-versa;
  and sense for an impeded signal between the second and third ports that is indicative of a shared non-isolated termination.

62. The computer network according to claim 28, wherein said network scanner is adapted to:
  inject a scan signal through the second port;
  collect a respective returned signal through each port of the same panel;
  sense for an impeded signal between the first port and each of the other ports of the same panel; and
  determine that there is a shared non-isolated termination between the first port and another port of the same panel when an impeded signal is sensed between the first port and the other port of the same panel.

63. The computer network according to claim 62, wherein said network scanner is configured to:
  inject a scan signal through the first port;
  sense for a respective returned signal through at least the second port; and
  in case the respective returned signal is collected through the second port, generate an indication of multiple concurrent patchings between the first port and each of the second port and the third ports.

64. The computer network according to claim 62, wherein said network scanner is configured to:
  inject a scan signal through the first port;
  sense for a respective returned signal through at least the second port; and
  in case the respective returned signal is collected through the second port, generate an indication of multiple concurrent patchings between the first port and each of the second, third and fourth ports.

65. The computer network according to claim 28, wherein said network scanner is configured to:
  inject the scan signal through the first port;
  sense for a respective returned signal through a plurality of ports of one or more other panels; and
  in case the respective returned signal is collected through two or more ports of the other panel(s), generate an indication of multiple concurrent patchings between the first port and the two or more ports of the other panel(s) through which the returned signal was collected.

66. The computer network according to claim 28, wherein said network scanner is adapted to Inject the scan signal through one or more twisted pairs from among the standard 4 twisted pairs of RJ-45 ports.

67. The computer network according to claim 28, wherein said network scanner is adapted to sense for the returned signal through one or more twisted pairs from among the standard 4 twisted pairs of RJ-45 ports.

* * * * *